(12) United States Patent
Lee et al.

(10) Patent No.: US 11,501,824 B2
(45) Date of Patent: Nov. 15, 2022

(54) VOLATILE MEMORY DEVICE AND DATA SENSING METHOD THEREOF

(71) Applicant: SAMSUNG ELECTRONICS CO., LTD., Suwon-si (KR)

(72) Inventors: Dongil Lee, Hwaseong-si (KR); Younghun Seo, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 100 days.

(21) Appl. No.: 17/002,002

(22) Filed: Aug. 25, 2020

(65) Prior Publication Data

US 2021/0241818 A1    Aug. 5, 2021

(30) Foreign Application Priority Data

Feb. 5, 2020    (KR) ........................ 10-2020-0013733

(51) Int. Cl.
     *G11C 11/4091*      (2006.01)
     *G11C 11/4094*      (2006.01)
     *G11C 11/56*      (2006.01)

(52) U.S. Cl.
     CPC ...... *G11C 11/4091* (2013.01); *G11C 11/4094* (2013.01); *G11C 11/565* (2013.01)

(58) Field of Classification Search
     CPC .................. G11C 11/4091; G11C 11/4094
     USPC ......................................................... 365/203
     See application file for complete search history.

(56) References Cited

U.S. PATENT DOCUMENTS

| | | | |
|---|---|---|---|
| 5,283,761 A | | 2/1994 | Gillingham |
| 5,337,283 A | * | 8/1994 | Ishikawa ............. G11C 11/4091 |
| | | | 365/230.03 |
| 5,859,794 A | | 1/1999 | Chan |
| 6,845,049 B2 | | 1/2005 | Lim et al. |
| 7,423,911 B2 | | 9/2008 | Kang |
| 7,961,537 B2 | | 6/2011 | Lee |
| 8,102,695 B2 | | 1/2012 | Ono et al. |
| 8,144,526 B2 | | 3/2012 | Shiah |
| 8,451,649 B2 | | 5/2013 | Choi |
| 2005/0232042 A1 | | 10/2005 | Kim et al. |
| 2007/0139994 A1 | | 6/2007 | Song et al. |
| 2015/0371713 A1 | | 12/2015 | Lee et al. |

(Continued)

FOREIGN PATENT DOCUMENTS

KR      1020200052803 A      5/2020

OTHER PUBLICATIONS

Communication dated Oct. 21, 2021, from the Intellectual Property Office of Taiwan in Application No. 109145194.

*Primary Examiner* — Anthan Tran
(74) *Attorney, Agent, or Firm* — Sughrue Mion. PLLC

(57) ABSTRACT

A volatile memory device includes: a first sense amplifier connected to a first memory cell through a first bit line, and configured to sense 2-bit data stored in the first memory cell; a second sense amplifier connected to a second memory cell through a second bit line, and configured to sense 2-bit data stored in the second memory cell, the second bit line having a length greater than a length of the first bit line; and a driving voltage supply circuit configured to supply a first driving voltage to the first sense amplifier, and supply a second driving voltage to the second sense amplifier, the second driving voltage having a voltage level different from a voltage level of the first driving voltage.

18 Claims, 17 Drawing Sheets

(56) References Cited

U.S. PATENT DOCUMENTS

2019/0189192 A1* 6/2019 Kim .................... G11C 11/4091
2020/0143869 A1 5/2020 Seo et al.

* cited by examiner

VOLATILE MEMORY DEVICE AND DATA SENSING METHOD THEREOF

CROSS-REFERENCE TO THE RELATED APPLICATION

This application is based on and claims priority from Korean Patent Application No. 10-2020-0013733, filed on Feb. 5, 2020, in the Korean Intellectual Property Office, the disclosure of which is incorporated herein in its entirety by reference.

BACKGROUND

Embodiments of the inventive concept relate to a volatile memory device and a data sensing method thereof, and more particularly, to a volatile memory device including a plurality of sense amplifiers and an operating method of the volatile memory device.

A dynamic random access memory (DRAM) is operated by writing and reading data based on a charge stored in a cell capacitor of a memory cell. With the increasing demand for a high-capacity DRAM, research on storing at least two bits of data in a single DRAM cell, i.e., the development of a multi-level cell storing multi-bit data, has been required. To realize a multi-level cell DRAM, a sense amplifier capable of sensing a charge stored in a cell capacitor as multi-bit data is needed.

SUMMARY

The embodiments of the inventive concept provide a volatile memory device capable of compensating for a sensing characteristic difference between sense amplifiers, which occurs due to a length difference between bit lines, and a data sensing method of the volatile memory device.

According to an aspect of embodiments, there is provided a volatile memory device including: a first sense amplifier connected to a first memory cell through a first bit line, and configured to sense 2-bit data stored in the first memory cell; a second sense amplifier connected to a second memory cell through a second bit line, and configured to sense 2-bit data stored in the second memory cell, the second bit line having a length greater than a length of the first bit line; and a driving voltage supply circuit configured to supply a first driving voltage to the first sense amplifier, and supply a second driving voltage to the second sense amplifier, the second driving voltage having a voltage level different from a voltage level of the first driving voltage.

According to another aspect of the embodiments, there is provided a data sensing method of a volatile memory device. The data sensing method includes precharging a first bit line using a first precharge voltage; sensing first 2-bit data through a first sense amplifier connected to the first bit line, the first 2-bit data being stored in a first memory cell connected between the first bit line and a selected word line; precharging a second bit line using a second precharge voltage different from the first precharge voltage, the second bit line having a length greater than a length of the first bit line; and sensing second 2-bit data through a second sense amplifier connected to the second bit line, the second 2-bit data being stored in a second memory cell connected between the second bit line and the selected word line.

According to still another aspect of the embodiments, there is provided a data sensing method of a memory device including volatile memory cells storing single-bit data. The data sensing method includes precharging a first bit line with a first precharge voltage in a sensing operation on a first memory cell connected to the first bit line having a first length; sensing first 1-bit data stored in the first memory cell; precharging a second bit line with a second precharge voltage in a sensing operation on a second memory cell connected to the second bit line having a second length greater than the first length; and sensing second 1-bit data stored in the second memory cell.

According to yet another aspect of the embodiments, there is provided a data sensing method of a memory device including volatile memory cells storing single-bit data. The data sensing method includes precharging a first bit line with a first precharge voltage in a sensing operation on a first memory cell connected to the first bit line; sensing first 1-bit data stored in the first memory cell; precharging a second bit line with the first precharge voltage in a sensing operation on a second memory cell connected to the second bit line; boosting a voltage level of the second bit line to a second precharge voltage; and sensing second 1-bit data stored in the second memory cell.

According to a further aspect of the inventive concept, there is provided a method of configuring sensing setting of a memory device including a first sense amplifier and a second sense amplifier. The method includes performing test sensing, according to various cell voltages, on the first sense amplifier and the second sense amplifier; obtaining first fail cell distribution with respect to the first sense amplifier and second fail cell distribution with respect to the second sense amplifier based on a test sensing result; and determining a voltage level of a first driving voltage for the first sense amplifier and a voltage level of a second driving voltage for the second sense amplifier based on the first fail cell distribution and the second fail cell distribution.

BRIEF DESCRIPTION OF THE DRAWINGS

Embodiments of the inventive concept will be more clearly understood from the following detailed description taken in conjunction with the accompanying drawings in which.

DETAILED DESCRIPTION OF THE EMBODIMENTS

Hereinafter, embodiments will be described in detail with reference to the accompanying drawings. It is noted that all the embodiment described herein are example embodiments.

Figure 1:
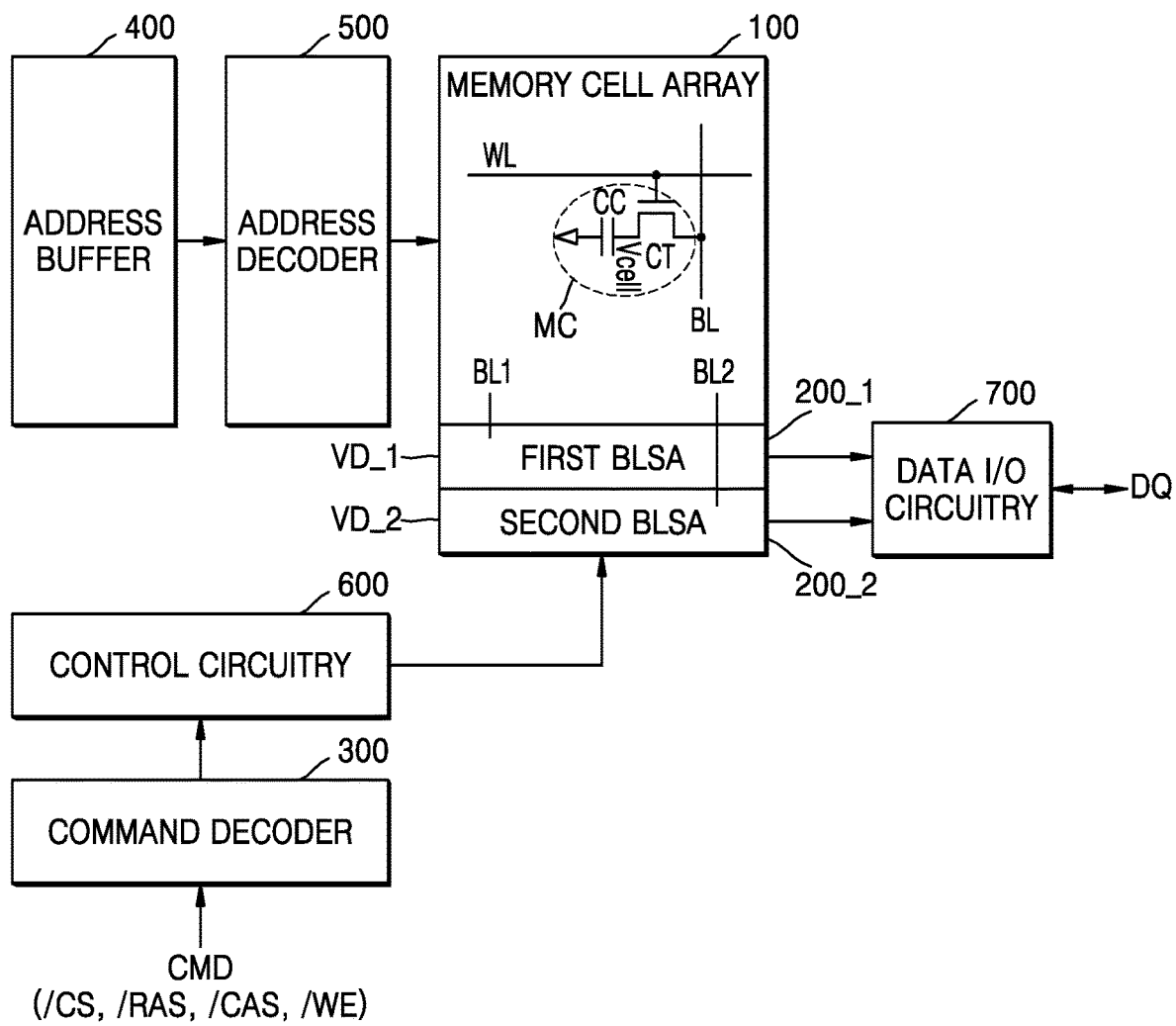
FIG. 1 illustrates a memory device according to an embodiment.

FIG. 1 illustrates a memory device 10 according to an embodiment. The memory device 10 may include a dynamic random access memory (DRAM), which senses a cell voltage Vcell stored in a memory cell MC as multi-bit data. The memory device 10 may be referred to as a multi-level DRAM. For example, the multi-level DRAM may be applied to a memory such as synchronous DRAM (SDRAM), double data rate (DDR) SDRAM, low power DDR SDRAM (LPDDR SDRAM), graphics DDR SDRAM (GDDR SDRAM), DDR2 SDRAM, DDR3 SDRAM, DDR4 SDRAM, and so on.

The memory device 10 may output data DQ in response to a command CMD and an address, which are received from an external device, e.g., a central processing unit (CPU) or a memory controller. The memory device 10 may include a memory cell array 100, a first sense amplifier 200_1, a second sense amplifier 200_2, a command decoder 300, an address buffer 400, an address decoder 500, a control circuitry 600, and a data input/output (I/O) circuitry 700.

The memory cell array 100 includes a plurality of memory cells MCs in a two-dimensional (2D) matrix of rows and columns. The memory cell array 100 includes a plurality of word lines WLs and bit lines BLs, which are connected to the memory cells MCs. Each of the memory cells MCs includes a cell transistor CT and a cell capacitor CC. A gate of the cell transistor CT is connected to one of the word lines WLs arranged in a row direction of the memory cell array 100. One end of the cell transistor CT is connected to one of the bit lines BLs arranged in a column direction of the memory cell array 100. The other end of the cell transistor CT is connected to the cell capacitor CC. The cell capacitor CC may store various amounts of charges corresponding to multi-bit data, e.g., 2-bit data. The cell capacitor CC may be restored to a charge amount, i.e., the cell voltage Vcell, corresponding to the amount of multi-bit data. Alternatively, the cell capacitor CC may store an amount of charges corresponding to single-bit data. The cell capacitor CC may be restored to a charge amount, i.e., the cell voltage Vcell, corresponding to the amount of single-bit data.

The memory cell MC may store the cell voltage Vcell, which has a magnitude specifying 2-bit data. The cell voltage Vcell may be expressed as 2-bit data including a most significant bit (MSB) and a least significant bit (LSB).

According to an embodiment, the memory cell MC may store multi-bit data, which includes at least "n" bits (where "n" is a natural number greater than 2), or single-bit data.

The command decoder 300 may determine the command CMD with reference to a chip select signal/CS, a row address strobe signal/RAS, a column address strobe signal/CAS, a write enable signal/WE, and so on, which are received from an external device. The command decoder 300 may generate control signals corresponding to the command CMD. The command CMD may include an active command, a read command, a write command, a precharge command, or the like.

The address buffer 400 receives an address ADDR from the external device. The address ADDR includes a row address, which addresses a row of the memory cell array 100, and a column address, which addresses a column of the memory cell array 100. The address buffer 400 may transmit the row address and the column address to the address decoder 500.

The address decoder 500 may include a row decoder and a column decoder, which respectively select a word line WL and a bit line BL of a memory cell MC to be accessed in response to the address ADDR. The row decoder may decode the row address and enable a word line WL of the memory cell MC corresponding to the row address. The column decoder may decode the column address and provide a column select signal selecting a bit line BL of the memory cell MC corresponding to the column address.

The control circuitry 600 may control the first sense amplifier 200_1 and the second sense amplifier 200_2 under control of the command decoder 300. The control circuitry 600 may control operations of the first sense amplifier 200_1 and the second sense amplifier 200_2 when each of the first sense amplifier 200_1 and the second sense amplifier 200_2 senses a cell voltage Vcell of a corresponding memory cell MC. The control circuitry 600 may control the first sense amplifier 200_1 and the second sense amplifier 200_2 to sequentially perform a precharge operation, an offset cancel operation, an MSB sensing operation, an LSB sensing operation, and a restore operation. The control circuitry 600 may selectively turn on or off elements, e.g., first and second latches 210 and 220 and a plurality of switches SWa, SWb, SW10, and SW1 through SW6, of a sense amplifier 200 of FIG. 4 which corresponds to either one of the first sense amplifier 200_1 and the second sense amplifier 200_2.

Each of the first sense amplifier 200_1 and the second sense amplifier 200_2 may sense a charge stored in the corresponding memory cell MC as 2-bit data. Each of the first sense amplifier 200_1 and the second sense amplifier 200_2 may sense an LSB and an MSB of 2-bit data, and may restore a bit line voltage, which is generated by combining MSB data and LSB data, as a cell voltage in the corresponding memory cell MC. Each of the first sense amplifier 200_1 and the second sense amplifier 200_2 may also transmit the sensed 2-bit data to the data I/O circuitry 700 so that the sensed 2-bit data is output from the memory device 10 through a data pad or data pads.

Figure 2:
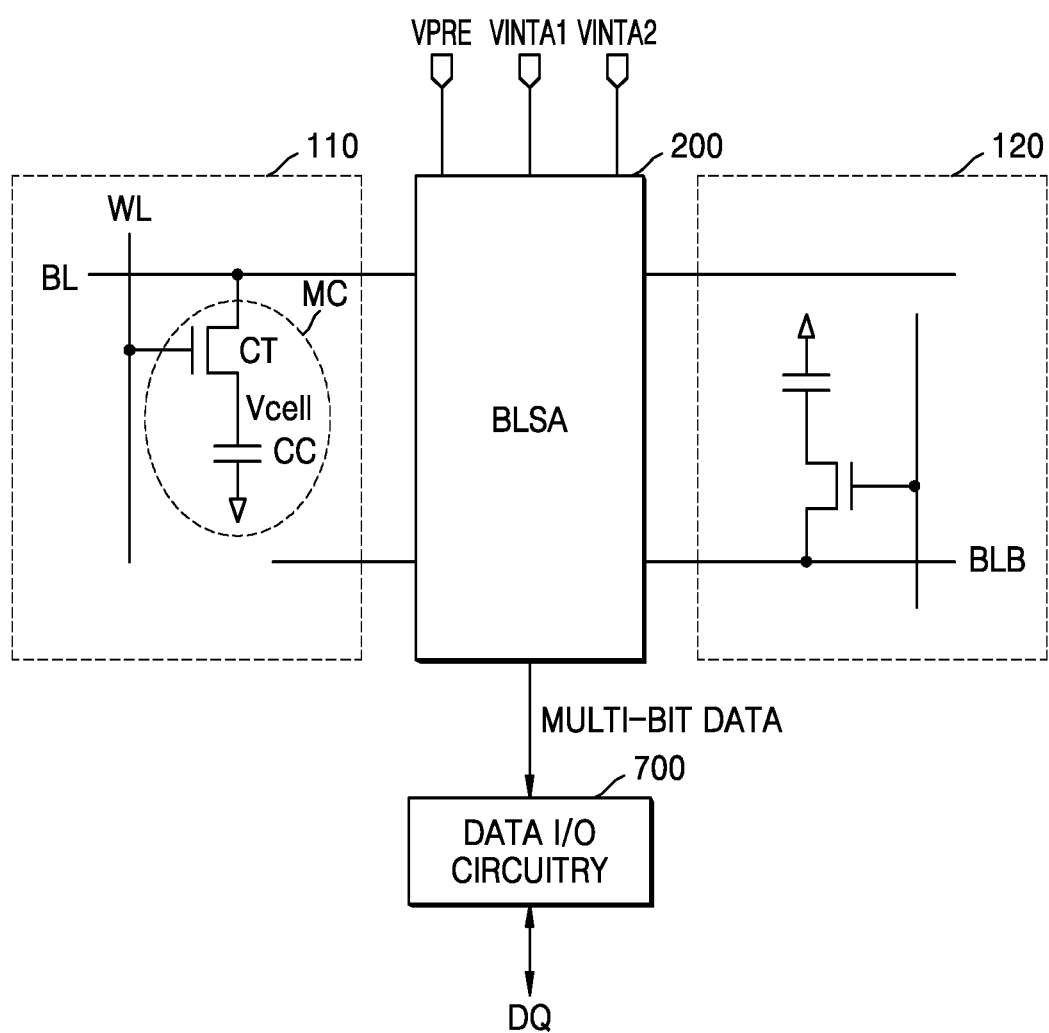
FIG. 2 illustrates a memory cell and a sense amplifier having an open bit line structure, according to an embodiment.

The first sense amplifier 200_1 may be connected to a first bit line BL1 and the second sense amplifier 200_2 may be connected to a second bit line BL2. According to an embodiment, as shown in FIG. 2, a complementary bit line may be connected to each of the first sense amplifier 200_1 and the second sense amplifier 200_2 in a memory device having an open bit line structure.

The data I/O circuitry 700 may externally receive data DQ to be written to the memory cells MCs and transmit the data DQ to the memory cell array 100. The data I/O circuitry 700 may output 2-bit data, which is sensed by the first sense amplifier 200_1 or the second sense amplifier 200_2, to the outside of the memory device 10 through the data pad(s). According to an embodiment, when outputting the sensed 2-bit data, the data I/O circuitry 700 may output MSB data and LSB data in series through a single data pad. Contrarily, the LSB data and the MSB data may be output in series through the single data pad. According to an embodiment, the data I/O circuitry 700 may output sensed 2-bit data in parallel through two data pads. For example, MSB data may be output through a first data pad and LSB data may be output through a second data pad.

In the memory device 10, the length of the first bit line BL1 connected to the first sense amplifier 200_1 may be different from the length of the second bit line BL2 connected to the second sense amplifier 200_2, and accordingly, capacitance of the first bit line BL1 may be different from capacitance of the second bit line BL2. Therefore, sensing characteristics of the first sense amplifier 200_1 may be different from sensing characteristics of the second sense amplifier 200_2. At this time, that there is a sensing characteristic difference may refer to that there is a sensing margin difference. For example, even when a sensing operation is performed on memory cells having the same cell voltage Vcell, the first sense amplifier 200_1 may perform correct sensing, but the second sense amplifier 200_2 may perform incorrect sensing. Therefore, a method of compensating for a sensing characteristic difference caused by a length difference between bit lines is desired.

According to an embodiment, to compensate for a sensing characteristic difference caused by a length difference between the first bit line BL1 and the second bit line BL2, the memory device 10 may drive the first sense amplifier 200_1 and the second sense amplifier 200_2 using different driving voltages, respectively. For example, the memory device 10 may provide a first driving voltage VD_1 to the first sense amplifier 200_1 and a second driving voltage VD_2 to the second sense amplifier 200_2. In an embodiment, a driving voltage may include at least one of a precharge voltage, a first latch driving voltage, and a second latch driving voltage. In other words, in an embodiment, the first bit line BL1 and the second bit line BL2 may be respectively charged using different precharge voltages in a precharge operation period of a sensing operation. In an embodiment, during an MSB sensing operation, a first latch of the first sense amplifier 200_1 may be driven by a first latch driving voltage having a first voltage level, and a first latch of the second sense amplifier 200_2 may be driven by the first latch driving voltage having a second voltage level different from the first voltage level. In an embodiment, during an MSB sensing operation or an LSB sensing operation, a second latch of the first sense amplifier 200_1 may be driven by a second latch driving voltage having a third voltage level, and a second latch of the second sense amplifier 200_2 may be driven by the second latch driving voltage having a fourth voltage level different from the third voltage level. Specific embodiments will be described in detail with reference to the drawings below.

According to the present embodiment, the memory device 10 may provide the first driving voltage VD_1 to the first sense amplifier 200_1 connected to the first bit line BL1, and provide the second driving voltage VD_2 to the second sense amplifier 200_2 connected to the second bit line BL2. Accordingly, a sensing characteristic difference caused by a length difference between the first bit line BL1 and the second bit line BL2 may be compensated for.

FIG. 2 illustrates a plurality of memory cells MC and a sense amplifier 200 having an open bit line structure, according to an embodiment. The sense amplifier 200 of FIG. 2 may correspond to either one of the first sense amplifier 200_1 and the second sense amplifier 200_2 in FIG. 1. FIG. 2 will be described with reference to FIG. 1 together.

Referring to FIG. 2, the sense amplifier 200 may be connected to the memory cells MC through a pair of bit lines, e.g., a bit line BL and a complementary bit line BLB. In particular, the sense amplifier 200 may have an open bit line structure, and may be connected to the memory cells MC. In the open bit line structure, the bit line BL and the complementary bit line BLB in a pair are separately disposed in main cell blocks 110 and 120 adjacent to the sense amplifier 200, respectively. In the open bit line structure, when a word line WL of a memory cell MC, included in the main cell block 110, that is enabled, data may be read from or written to the memory cell MC through the bit line BL that is selected. At this time, while the memory cell MC is being accessed through the bit line BL that is selected, the complementary bit line BLB may remain at a level of a precharge voltage VPRE as a reference voltage level because there is no selected memory cell connected to the complementary bit line BLB in the main cell block 120. Accordingly, the sense amplifier 200 may sense a cell voltage Vcell of the memory cell MC using a shared charge through the bit line BL.

The sense amplifier 200 may sense the cell voltage Vcell stored in the memory cell MC in the main cell block 110 as MSB and LSB of 2-bit data, and may restore the cell voltage Vcell corresponding to the sensed MSB and LSB in the memory cell MC. The sense amplifier 200 may perform first through third charge sharing operations using a cell capacitance of the memory cell MC, a bit line capacitance of a bit line pair, e.g., BL and BLB, a holding bit line pair, e.g., a holding bit line HBL and a complementary holding bit line HBLB in FIG. 4, a first sensing bit line pair, e.g., a first sensing bit line SBL1 and a first complementary sensing bit line SBLB1 shown in FIG. 4, and a second sensing bit line pair, e.g., a second sensing bit line SBL2 and a second complementary sensing bit line SBLB2 shown in FIG. 4, and variations in these capacitances. The sense amplifier 200 may sense the MSB and LSB of 2-bit data by performing the first through third charge sharing operations, and may restore the cell voltage Vcell corresponding to the sensed MSB and LSB data in the memory cell MC. Hereinafter, the first through third charge sharing operations of the sense amplifier 200 will be described.

In the sense amplifier 200, the first charge sharing operation may occur between a charge stored in a cell capacitor CC having a cell capacitance and a charge stored in the bit line BL and the holding bit line HBL, each having a bit line capacitance. The sense amplifier 200 may sense MSB data of the memory cell MC by performing the first charge sharing operation.

In the sense amplifier 200, the second charge sharing operation may include charge sharing, which occurs between a charge stored in the bit line BL and the holding bit line HBL and a charge stored in the first sensing bit line SBL1, and charge sharing, which occurs between a charge stored in the complementary bit line BLB and the complementary holding bit line HBLB and a charge stored in the first complementary sensing bit line SBLB1. The sense amplifier 200 may sense LSB data of the memory cell MC by performing the second charge sharing operation.

In the sense amplifier 200, the third charge sharing operation may occur among a charge stored in the bit line BL of the memory cell MC, a charge stored in the holding bit line HBL storing the LSB data of the memory cell MC, a charge stored in the second complementary sensing bit line SBLB2 storing the MSB data of the memory cell MC, a charge stored in the first complementary sensing bit line SBLB1, a charge stored in the complementary bit line BLB and the complementary holding bit line HBLB, and a charge stored in the first sensing bit line SBL1. The sense amplifier 200 may combine the sensed MSB data with the sensed LSB data by performing the third charge sharing operation. The sense amplifier 200 may restore the cell voltage Vcell, which is generated by the combination of the sensed MSB and LSB data, in the memory cell MC.

In a read mode of the memory device 10, the sense amplifier 200 may electrically connect the second sensing bit line pair, e.g., SBL2 and SBLB2, and the bit line pair, e.g., BL and BLB, to the data I/O circuitry 700 in response to a column select signal, wherein the second sensing bit line pair, e.g., SBL2 and SBLB2, store the MSB data of the memory cell MC sensed in the first and second charge sharing operations, and the bit line pair, e.g., BL and BLB, store the LSB data of the memory cell MC sensed in the first and second charge sharing operations. The data I/O circuitry 700 may output the MSB data and the LSB data in series through a single data pad or in parallel through two data pads.

Figure 3:
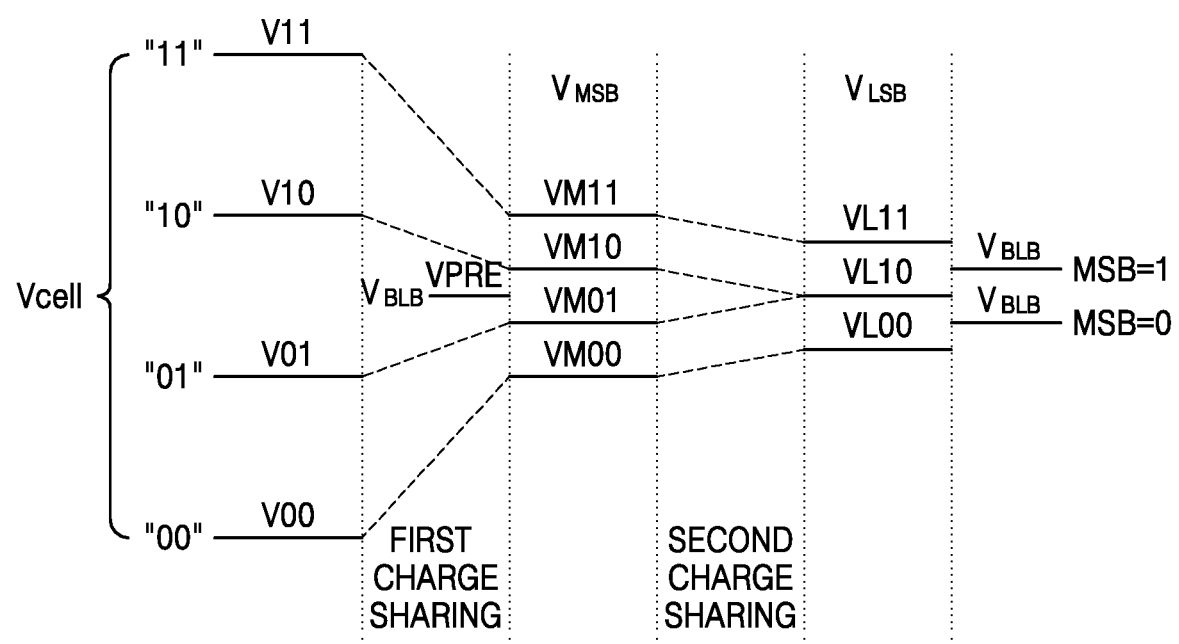
FIG. 3 is a diagram for describing multi-bit data of a memory cell sensed by a sense amplifier, according to an embodiment.

FIG. 3 is a diagram for describing multi-bit data of a memory cell sensed by a sense amplifier, according to an embodiment. FIG. 3 will be described with reference to FIGS. 1 and 2 together.

Referring to FIG. 3, the cell voltage Vcell of the memory cell MC may be expressed as the MSB and LSB of 2-bit data. The cell voltage Vcell may be expressed as a bit combination, i.e., "00", "01", "10", or "11". For example, the cell voltage Vcell having a voltage level V00 may indicate the bit combination "00", the cell voltage Vcell having a voltage level V01 may indicate the bit combination "01", the cell voltage Vcell having a voltage level V10 may indicate the bit combination "10", and the cell voltage Vcell having a voltage level V11 may indicate the bit combination "11".

When the first charge sharing operation is performed between a charge stored in the cell capacitor CC and a charge stored in the bit line BL and the holding bit line HBL in the sense amplifier 200 sensing MSB data of the memory cell MC, the bit line BL and the holding bit line HBL are captured as an MSB voltage V_MSB. The bit line BL may transit from the level of the precharge voltage VPRE to the MSB voltage V_MSB. At this time, the complementary bit line BLB may remain at the level of the precharge voltage VPRE.

For example, due to the first charge sharing operation on the cell voltage Vcell having the voltage level V00, the voltage level of the bit line BL may be captured as the MSB voltage V_MSB at a voltage level VM00. For example, due to the first charge sharing operation on the cell voltage Vcell having the voltage level V01, the voltage level of the bit line BL may be captured as the MSB voltage V_MSB at a voltage level VM01. For example, due to the first charge sharing operation on the cell voltage Vcell having the voltage level V10, the voltage level of the bit line BL may be captured as the MSB voltage V_MSB at a voltage level VM10. For example, due to the first charge sharing operation on the cell voltage Vcell having the voltage level V11, the voltage level of the bit line BL may be captured as the MSB voltage V_MSB at a voltage level VM11. At this time, the complementary bit line BLB may remain at the level of the precharge voltage VPRE.

When the second charge sharing operation including charge sharing, which occurs between a charge stored in the bit line BL and the holding bit line HBL and a charge stored in the first sensing bit line SBL1, and charge sharing, which occurs between a charge stored in the complementary bit line BLB and the complementary holding bit line HBLB and a charge stored in the first complementary sensing bit line SBLB1, is performed in the sense amplifier 200 sensing LSB data of the memory cell MC, the bit line BL that is selected is captured as an LSB voltage V_LSB. The bit line BL that is selected may transit from the MSB voltage V_MSB to the LSB voltage V_LSB.

For example, due to the second charge sharing operation, the voltage level of the bit line BL having the MSB voltage V_MSB at the voltage level VM00 may be captured as the LSB voltage V_LSB at a voltage level VL00. For example, due to the second charge sharing operation, the voltage level of the bit line BL having the MSB voltage V_MSB at the voltage level VM01 may be captured as the LSB voltage V_LSB at a voltage level VL10. For example, due to the second charge sharing operation, the voltage level of the bit line BL having the MSB voltage V_MSB at the voltage level VM10 may be captured as the LSB voltage V_LSB at the voltage level VL10. For example, due to the second charge sharing operation, the voltage level of the bit line BL having the MSB voltage V_MSB at the voltage level VM11 may be captured as the LSB voltage V_LSB at a voltage level VL11.

When the sense amplifier 200 senses the cell voltage Vcell of the memory cell MC as the MSB and LSB data of a 2-bit combination, the voltage level of the holding bit line HBL and the bit line BL having an LSB voltage level acts as a self-reference having a certain voltage difference from the voltage level of the complementary bit line BLB and the complementary holding bit line HBLB.

Figure 4:
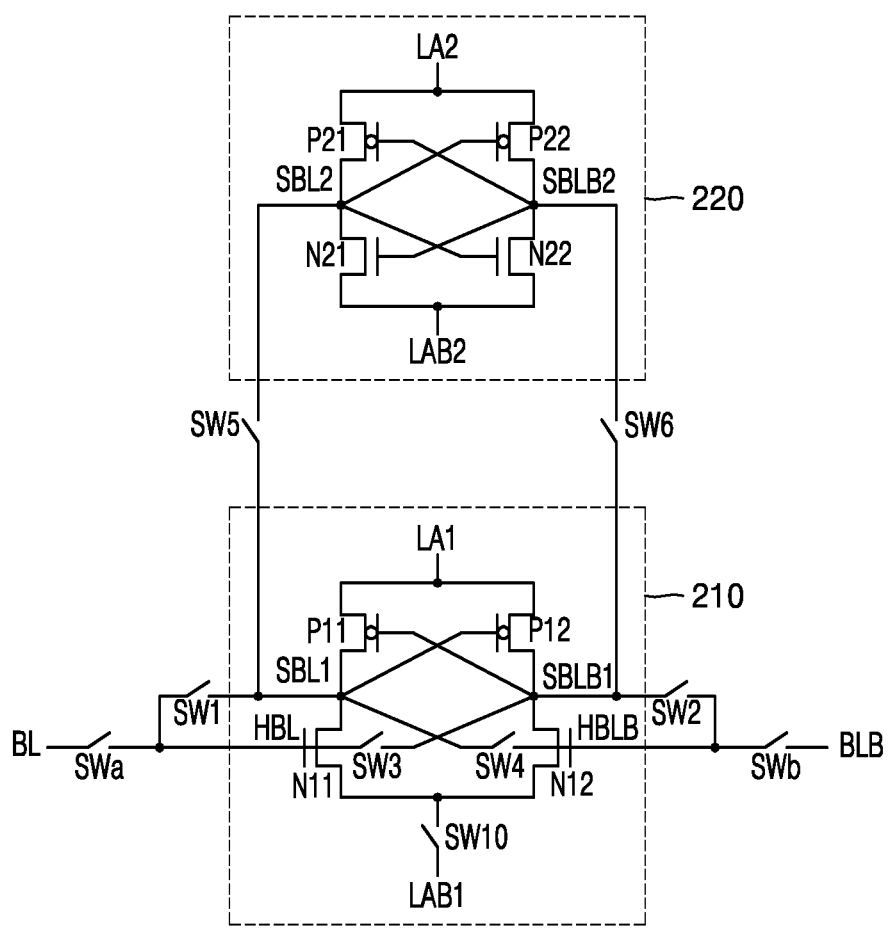
FIG. 4 illustrates a sense amplifier according to an embodiment.

FIG. 4 illustrates the sense amplifier 200 according to an embodiment. The sense amplifier 200 of FIG. 4 may correspond to the first sense amplifier 200_1 or the second sense amplifier 200_2 in FIG. 1. FIG. 4 will be described with reference to FIG. 1 together.

Referring to FIG. 4, the sense amplifier 200 includes a first latch 210, the second latch 220, and a switching circuit, which includes a bit line switch SWa, a complementary bit line switch SWb, a power switch SW10, and first through sixth switches SW1 through SW6.

The first latch 210 is connected to a first latch pull-up driving signal LA1 and a first latch pull-down driving signal LAB1, and includes first and second P-type metal oxide semiconductor (PMOS) transistors P11 and P12 and first and second N-type MOS (NMOS) transistors N11 and N12. A power supply voltage VINTA, a ground voltage VSS, or the precharge voltage VPRE may be applied to the first latch pull-up driving signal LA1 and the first latch pull-down driving signal LAB1 under the control of the control circuitry 600 (in FIG. 1), which controls the operations of the sense amplifier 200.

One end of the first PMOS transistor P11 is connected to a line of the first latch pull-up driving signal LA1, the other end of the first PMOS transistor P11 is connected to a first sensing bit line SBL1, and a gate of the first PMOS transistor P11 is connected to a first complementary sensing bit line SBLB1. One end of the second PMOS transistor P12 is connected to the line of the first latch pull-up driving signal LA1, the other end of the second PMOS transistor P12 is connected to the first complementary sensing bit line SBLB1, and a gate of the second PMOS transistor P12 is connected to the first sensing bit line SBL1.

One end of the first NMOS transistor N11 is connected to the power switch SW10, the other end of the first NMOS transistor N11 is connected to the first sensing bit line SBL1, and a gate of the first NMOS transistor N11 is connected to the holding bit line HBL. One end of the second NMOS transistor N12 is connected to the power switch SW10, the other end of the second NMOS transistor N12 is connected to the first complementary sensing bit line SBLB1, and a gate of the second NMOS transistor N12 is connected to the complementary holding bit line HBLB.

The bit line switch SWa is connected between the bit line BL and the holding bit line HBL, and is turned on or off under the control of the control circuitry 600. The complementary bit line switch SWb is connected between the complementary bit line BLB and the complementary holding bit line HBLB, and is turned on or off under the control of the control circuitry 600. The power switch SW10 is connected among the respective ends of the first and second NMOS transistors N11 and N12 and a line of the first latch pull-down driving signal LAB1, and is turned on or off under the control of the control circuitry 600.

The first switch SW1 is connected between the holding bit line HBL and the first sensing bit line SBL1, and is turned on or off under the control of the control circuitry 600. The second switch SW2 is connected between the complementary holding bit line HBLB and the first complementary sensing bit line SBLB1, and is turned on or off under the control of the control circuitry 600. The third switch SW3 is connected between the holding bit line HBL and the first complementary sensing bit line SBLB1, and is turned on or off under the control of the control circuitry 600. The fourth switch SW4 is connected between the complementary holding bit line HBLB and the first sensing bit line SBL1, and is turned on or off under the control of the control circuitry 600.

The second latch 220 is connected to a second latch pull-up driving signal LA2 and a second latch pull-down driving signal LAB2, and includes third and fourth PMOS transistors P21 and P22 and third and fourth NMOS transistors N21 and N22.

One end of the third PMOS transistor P21 is connected to a line of the second latch pull-up driving signal LA2, the other end of the third PMOS transistor P21 is connected to a second sensing bit line SBL2, and a gate of the third PMOS transistor P21 is connected to a second complementary sensing bit line SBLB2. One end of the fourth PMOS transistor P22 is connected to the line of the second latch pull-up driving signal LA2, the other end of the fourth PMOS transistor P22 is connected to the second complementary sensing bit line SBLB2, and a gate of the fourth PMOS transistor P22 is connected to the second sensing bit line SBL2.

One end of the third NMOS transistor N21 is connected to a line of the second latch pull-down driving signal LAB2, the other end of the third NMOS transistor N21 is connected to the second sensing bit line SBL2, and a gate of the third NMOS transistor N21 is connected to the second complementary sensing bit line SBLB2. One end of the fourth NMOS transistor N22 is connected to the line of the second latch pull-down driving signal LAB2, the other end of the fourth NMOS transistor N22 is connected to the second complementary sensing bit line SBLB2, and a gate of the fourth NMOS transistor N22 is connected to the second sensing bit line SBL2.

The fifth switch SW5 is connected between the first sensing bit line SBL1 and the second sensing bit line SBL2, and is turned on or off under the control of the control circuitry 600. The sixth switch SW6 is connected between the first complementary sensing bit line SBLB1 and the second complementary sensing bit line SBLB2, and is turned on or off under the control of the control circuitry 600.

FIGS. 5A through 5D are flowcharts of sequential operations of a sense amplifier, according to an embodiment.

Figure 5A:
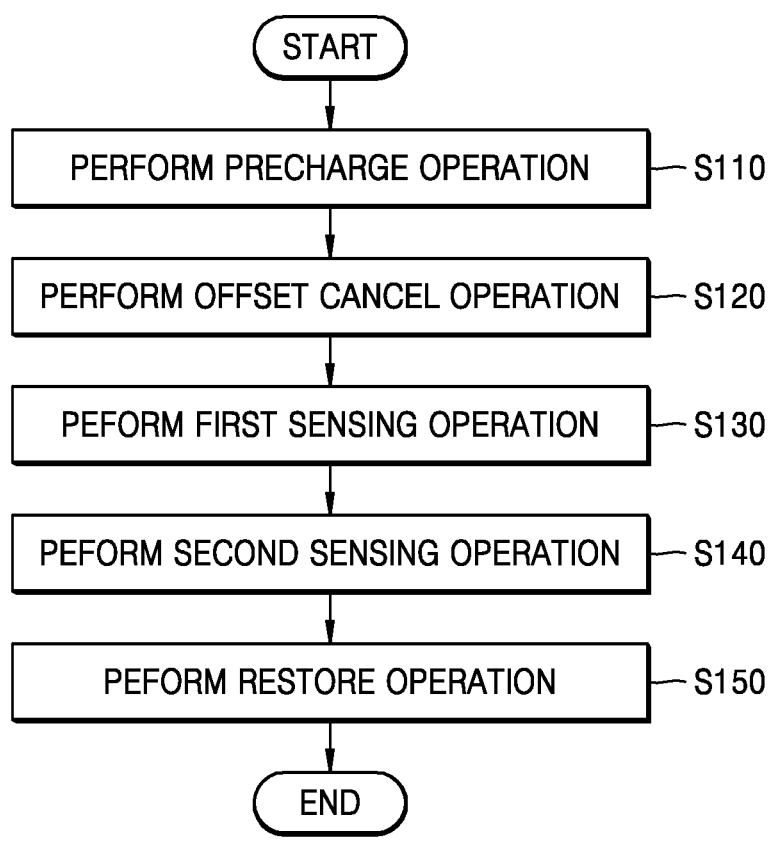
FIGS. 5A through 5D are flowcharts of sequential operations of a sense amplifier, according to an embodiment.

According to FIG. 5A in reference with FIGS. 2 to 4, in operation S110, the sense amplifier 200 may perform a precharge operation. The sense amplifier 200 may precharge the bit line BL, the holding bit line HBL, the complementary bit line BLB, the complementary holding bit line HBLB, the first sensing bit line SBL1, the first complementary sensing bit line SBLB1, the second sensing bit line SBL2, the second complementary sensing bit line SBLB2, the first latch pull-up driving signal LA1, the first latch pull-down driving signal LAB1, the second latch pull-up driving signal LA2, and the second latch pull-down driving signal LAB2 with the precharge voltage VPRE.

In operation S120, the sense amplifier 200 may perform an offset cancel operation. In the sense amplifier 200 having the open bit line structure described with reference to FIG. 2, noise such as a process variation, a temperature, or a threshold voltage difference between transistors may appear differently between a pair of bit lines, i.e., the bit line BL and the complementary bit line BLB. Such different noise between the bit line BL and the complementary bit line BLB may act as offset noise during a sensing operation of the sense amplifier 200, thereby reducing an effective sensing margin. Therefore, the sense amplifier 200 performs the offset cancel operation to increase the effective sensing margin before a sensing operation.

In operation S130, the sense amplifier 200 may perform a first sensing operation to sense the MSB of a 2-bit combination indicating the cell voltage Vcell stored in the memory cell MC. This MSB sensing operation may include a first charge sharing operation occurring between a charge stored in the memory cell MC and a charge stored in the bit line BL and the holding bit line HBL.

The first charge sharing operation occurs between a charge stored in the cell capacitor CC having a cell capacitance and a charge stored in the bit line BL and the holding bit line HBL, each having a bit line capacitance. As a result of the first charge sharing operation, the voltage level of the bit line BL and the holding bit line HBL may appear as the MSB voltage V_MSB (in FIG. 3) corresponding to the bit combination "00", "01", "10", or "11". The sense amplifier 200 may sense and amplify the difference between the MSB voltage V_MSB and a complementary bit line voltage VBLB of the complementary bit line BLB, and may latch MSB data of logic "1" or logic "0" having the level of the power supply voltage VINTA or the ground voltage VSS.

In operation S140, the sense amplifier 200 may perform a second sensing operation to sense the LSB of the 2-bit combination indicating the cell voltage Vcell stored in the memory cell MC. The LSB sensing operation may include a second charge sharing operation.

The second charge sharing operation may include charge sharing, which occurs between a charge stored in the bit line BL and the holding bit line HBL and a charge stored in the first sensing bit line SBL1, and charge sharing, which occurs between a charge stored in the complementary bit line BLB and the complementary holding bit line HBLB and a charge stored in the first complementary sensing bit line SBLB1.

As a result of the second charge sharing operation, the voltage level of the bit line BL and the holding bit line HBL may appear as the LSB voltage V_LSB (in FIG. 3) corresponding to the bit combination "00", "01", "10", or "11". The sense amplifier 200 may sense and amplify the difference between the LSB voltage V_LSB and each of the complementary bit line voltage $V_{BLB}$ and the complementary holding bit line HBLB, and may latch LSB data of logic "1" or logic "0" having the level of the power supply voltage VINTA or the ground voltage VSS.

In operation S150, the sense amplifier 200 may perform a restore operation by rewriting the cell voltage Vcell, which is generated by combining the sensed MSB data with the sensed LSB data, to the memory cell MC. The restore operation may include a third charge sharing operation.

As a result of sensing the MSB and LSB data in operations S130 and S140, the LSB data having a corresponding logic level is stored in the bit line BL and the holding bit line HBL, and the MSB data having a corresponding logic level is stored in the first sensing bit line SBL1, the complementary bit line BLB, the complementary holding bit line HBLB, and the first complementary sensing bit line SBLB1.

The third charge sharing operation may be performed using the cell capacitance of the memory cell MC, the bit line capacitance of the bit line pair, e.g., BL and BLB, the bit line capacitance of the holding bit line pair, e.g., HBL and HBLB, and the bit line capacitance of the first sensing bit line pair, e.g., SBL1 and SBLB1, and variations in the capacitances. The MSB and LSB data sensed by the third charge sharing operation may be combined. The sense amplifier 200 may restore the cell voltage Vcell, which is generated by combining the sensed MSB data with the sensed LSB data, in the memory cell MC.

For convenience of description, the detailed flowcharts of FIGS. 5B through 5D will be described in conjunction with FIG. 6.

Figure 6:
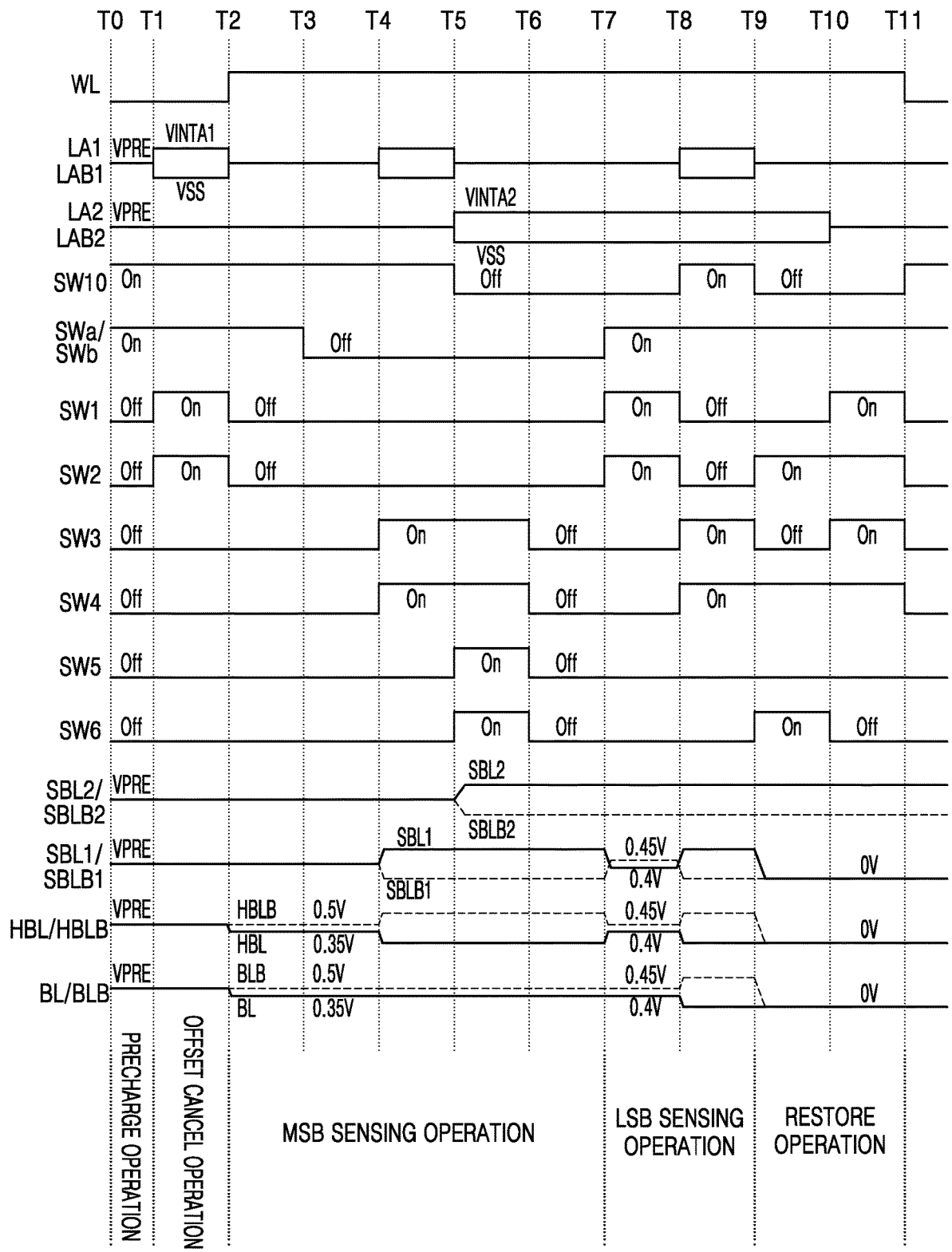
FIG. 6 is a timing diagram of signals of a sense amplifier sensing 2-bit data "00", according to an embodiment.

FIG. 6 is a timing diagram of signals of a sense amplifier sensing 2-bit data "00", according to an embodiment. For convenience of description, the operations of the sense amplifier sensing the 2-bit data "00" will be described in detail.

1. Precharge Operation

Referring to FIG. 5A and a time point T0 in FIG. 6, in operation S110, the sense amplifier 200 precharges the bit line BL, the holding bit line HBL, the complementary bit line BLB, the complementary holding bit line HBLB, the first sensing bit line SBL1, the first complementary sensing bit line SBLB1, the second sensing bit line SBL2, the second complementary sensing bit line SBLB2, the first latch pull-up driving signal LA1, the first latch pull-down driving signal LAB1, the second latch pull-up driving signal LA2, and the second latch pull-down driving signal LAB2 with the precharge voltage VPRE.

The precharge voltage VPRE may be set to a voltage level which is half of the level of the power supply voltage VINTA. For example, when the power supply voltage VINTA is 1 V, the precharge voltage VPRE may be set to 0.5 V. According to an embodiment, the sense amplifier 200 may further include a precharge circuit, which may precharge the holding bit line HBL, the complementary holding bit line HBLB, the first sensing bit line SBL1, the first complementary sensing bit line SBLB1, the second sensing bit line SBL2, the second complementary sensing bit line SBLB2, the first latch pull-up driving signal LA1, the first latch pull-down driving signal LAB1, the second latch pull-up driving signal LA2, and the second latch pull-down driving signal LAB2 with the precharge voltage VPRE.

In the precharge operation, the first latch 210 and the second latch 220 may be in an off-state, the bit line switch SWa, the complementary bit line switch SWb, and the power switch SW10 are in an on-state, and the first through sixth switches SW1 through SW6 are on the off-state. When the first latch 210 is in the off-state, the precharge voltage VPRE is applied to the first latch pull-up driving signal LA1 and the first latch pull-down driving signal LAB1. When the second latch 220 is in the off-state, the precharge voltage VPRE is applied to the second latch pull-up driving signal LA2 and the second latch pull-down driving signal LAB2.

2. Offset Cancel Operation

Referring to FIG. 5A and a time point T1 in FIG. 6, in operation S120, the sense amplifier 200 performs the offset cancel operation. As shown in FIG. 2, the sense amplifier 200 has the open bit line structure such that the sense amplifier 200 is connected to a pair of the bit line BL and the complementary bit line BLB respectively located in the cell blocks 110 and 120 adjacent to the sense amplifier 200. In the open bit line structure, offset noise with respect to noise in the bit line BL and the complementary bit line BLB may be maximized during the sensing operation of the sense amplifier 200, and thus, reduce an effective sensing margin of the sense amplifier 200.

To increase the effective sensing margin of the sense amplifier 200, the sense amplifier 200 turns on the first latch 210 and the first and second switches SW1 and SW2 to perform the offset cancel operation. The power supply voltage VINTA is applied to the first latch pull-up driving signal LA1 of the first latch 210, and the ground voltage VSS is applied to the first latch pull-down driving signal LAB1 of the first latch 210.

The complementary bit line BLB may rise or drop to a certain level compared to the bit line BL due to the offset noise of the bit line pair, i.e., BL and BLB, in the first latch 210, and accordingly, there is a voltage difference between the bit line BL and the complementary bit line BLB. The voltage difference may be interpreted as an offset voltage resulting from the offset noise. When the bit line BL and the complementary bit line BLB are set to have a difference corresponding to the offset voltage, the offset noise of the sense amplifier 200 is removed. In other words, the sense amplifier 200 may compensate for an offset through the offset cancel operation.

3. First Charge Sharing Operation

Figure 5B:
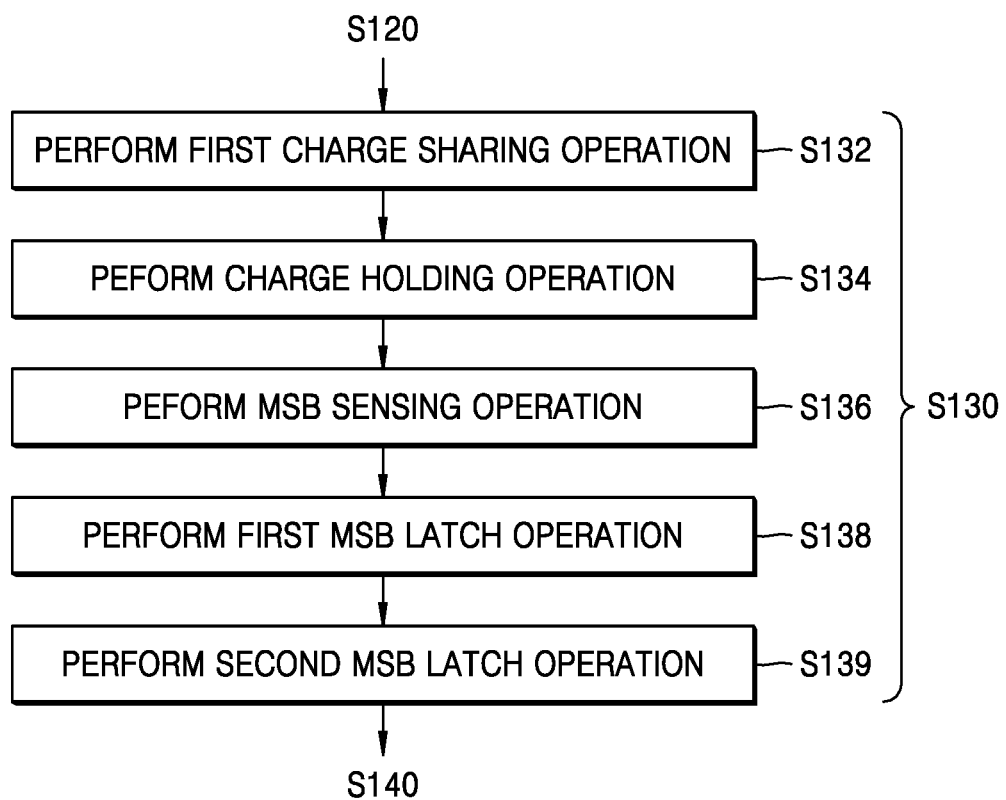

Referring to FIG. 5B and a time point T2 in FIG. 6, in operation 132, the sense amplifier 200 performs the first charge sharing operation between the memory cell MC and the bit line BL. The sense amplifier 200 turns off the first latch 210 and the first and second switches SW1 and SW2. At this time, the word line WL connected to the memory cell MC is enabled, and charge sharing occurs between a charge stored in the cell capacitor CC of the memory cell MC and a charge stored in the bit line BL and the holding bit line HBL.

When the cell voltage Vcell of 0 V is stored in the memory cell MC, the voltage level of the bit line BL and the holding bit line HBL may drop by a certain level from the level of the precharge voltage VPRE. At this time, the complementary bit line BLB and the complementary holding bit line HBLB may remain at the level of the precharge voltage VPRE.

4. Charge Holding Operation

Referring to FIG. 5B and a time point T3 in FIG. 6, in operation S134, the sense amplifier 200 holds the charge of the bit line BL and the holding bit line HBL, which results from the first charge sharing operation. The sense amplifier 200 turns off the bit line switch SWa and the complementary bit line switch SWb.

5. MSB Sensing Operation

Referring to FIG. 5B and a time point T4 in FIG. 6, in operation S136, the sense amplifier 200 performs an MSB sensing operation by sensing the MSB of the 2-bit combination indicating the cell voltage Vcell stored in the memory cell MC. The sense amplifier 200 turns on the first latch 210 and the third and fourth switches SW3 and SW4 to perform the MSB sensing operation. The power supply voltage VINTA is applied to the first latch pull-up driving signal LA1 of the first latch 210, and the ground voltage VSS is applied to the first latch pull-down driving signal LAB1 of the first latch 210. The holding bit line HBL is connected to the first complementary sensing bit line SBLB1 by the third switch SW3, and the complementary holding bit line HBLB is connected to the first sensing bit line SBL1 by the fourth switch SW4.

The first latch 210 may increase the voltage of the first sensing bit line SBL1 to a logic "1" level, and decrease the voltage of the first complementary sensing bit line SBLB1 to a logic "0" level. The voltage of the complementary holding bit line HBLB connected to the first sensing bit line SBL1 may rise to the logic "1" level, and the voltage of the holding bit line HBL connected to the first complementary sensing bit line SBLB1 may drop to the logic "0" level.

6. First MSB Latch Operation

Referring to FIG. 5B and a time point T5 in FIG. 6, in operation S138, the sense amplifier 200 performs a first MSB latch operation by latching the MSB of the 2-bit data. The sense amplifier 200 turns off the first latch 210 and the power switch SW10 and turns on the second latch 220 and the fifth and sixth switches SW5 and SW6 to perform the first MSB latch operation. The power supply voltage VINTA is applied to the second latch pull-up driving signal LA2 of the second latch 220, and the ground voltage VSS is applied to the second latch pull-down driving signal LAB2 of the second latch 220. The first sensing bit line SBL1 is connected to the second sensing bit line SBL2 by the fifth switch SW5, and the first complementary sensing bit line SBLB1 is connected to the second complementary sensing bit line SBLB2 by the sixth switch SW6. The power switch SW10 may be turned off to block a leakage current path interrupting the operation of the second latch 220 that is in the on-state.

The second latch 220 may perform sensing based on a voltage difference between the second sensing bit line SBL2 and the second complementary sensing bit line SBLB2, and may increase the voltage of the second sensing bit line SBL2 to the logic "1" level and decrease the voltage of the second complementary sensing bit line SBLB2 to the logic "0" level. The voltage of the first sensing bit line SBL1 and the complementary holding bit line HBLB, which are connected to the second sensing bit line SBL2, may become the logic "1" level. The voltage of the first complementary sensing bit line SBLB1 and the holding bit line HBL, which are connected to the second complementary sensing bit line SBLB2, may become the logic "0" level.

7. Second MSB Latch Operation

Referring to FIG. 5B and a time point T6 in FIG. 6, in operation 139, the sense amplifier 200 performs a second MSB latch operation. The sense amplifier 200 turns off the third through sixth switches SW3 through SW6 to perform the second MSB latch operation. The voltage of the second sensing bit line SBL2 may remain at the logic "1" level, the voltage of the second complementary sensing bit line SBLB2 may remain at the logic "0" level, the voltage of the first sensing bit line SBL1 may remain at the logic "1" level, the voltage of the first complementary sensing bit line SBLB1 may remain at the logic "0" level, the voltage of the holding bit line HBL may remain at the logic "0" level, and the voltage of the complementary holding bit line HBLB may remain at the logic "1" level.

The logic "0" level may be latched, as the MSB data of the memory cell MC, in the second complementary sensing bit line SBLB2 of the second latch 220.

8. Second Charge Sharing Operation

Figure 5C:
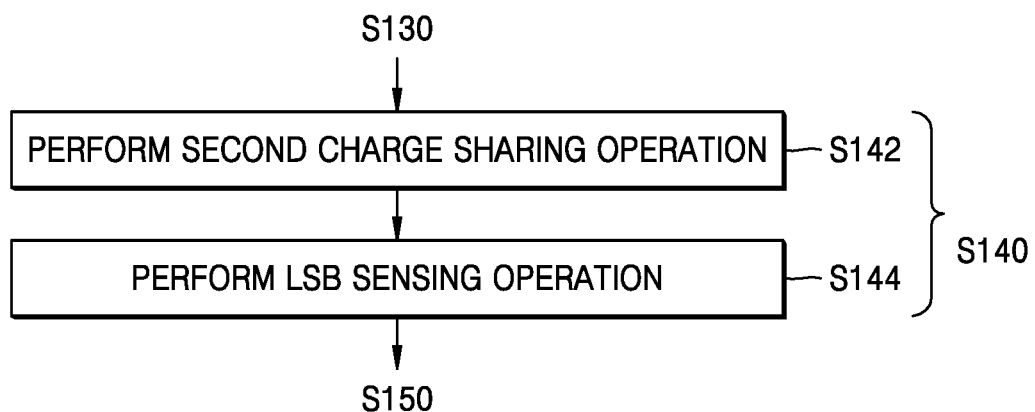

Referring to FIG. 5C and a time point T7 in FIG. 6, in operation 142, the sense amplifier 200 performs the second charge sharing operation among the first sensing bit line SBL1, the holding bit line HBL, and the bit line BL and among the first complementary sensing bit line SBLB1, the complementary holding bit line HBLB, and the complementary bit line BLB. The sense amplifier 200 turns on the bit line switch SWa, the complementary bit line switch SWb, and the first and second switches SW1 and SW2.

The bit line BL, the holding bit line HBL, and the first sensing bit line SBL1 are connected to one another by the bit line switch SWa and the first switch SW1. The complementary bit line BLB, the complementary holding bit line HBLB, and the first complementary sensing bit line SBLB1 are connected to one another by the complementary bit line switch SWb and the second switch SW2.

Charge sharing occurs among a charge stored in the bit line BL, a charge stored in the holding bit line HBL, and a charge stored in the first sensing bit line SBL1. Charge sharing also occurs among a charge stored in the complementary bit line BLB, a charge stored in the complementary holding bit line HBLB, and a charge stored in the first complementary sensing bit line SBLB1.

9. LSB Sensing Operation

Referring to FIG. 5C and a time point T8 in FIG. 6, in operation 144, the sense amplifier 200 performs an LSB sensing operation by sensing the LSB of the 2-bit combination indicating the cell voltage Vcell stored in the memory cell MC. The sense amplifier 200 turns on the first latch 210, the power switch SW10, and the third and fourth switches SW3 and SW4, and turns off the first and second switches SW1 and SW2 to perform the LSB sensing operation.

A first power supply voltage VINTA1 is applied to the first latch pull-up driving signal LA1 of the first latch 210, and the ground voltage VSS is applied to the first latch pull-down driving signal LAB1 of the first latch 210. The bit line BL, the holding bit line HBL, and the first complementary sensing bit line SBLB1 are connected to one another by the bit line switch SWa and the third switch SW3. The complementary bit line BLB, the complementary holding bit line HBLB, and the first sensing bit line SBL1 are connected to one another by the complementary bit line switch SWb and the fourth switch SW4.

The first latch 210 may increase the voltage of the first sensing bit line SBL1 to the logic "1" level, and decrease the voltage of the first complementary sensing bit line SBLB1 to the logic "0" level.

The voltage of the complementary bit line BLB and the complementary holding bit line HBLB, which are connected to the first sensing bit line SBL1, may rise to the logic "1" level. The voltage of the bit line BL and the holding bit line HBL, which are connected to the first complementary sensing bit line SBLB1, may drop to the logic "0" level.

The logic "0" level may be latched, as the LSB data of the memory cell MC, in the bit line BL of the first latch 210.

10. MSB and LSB Combining Operation

Figure 5D:
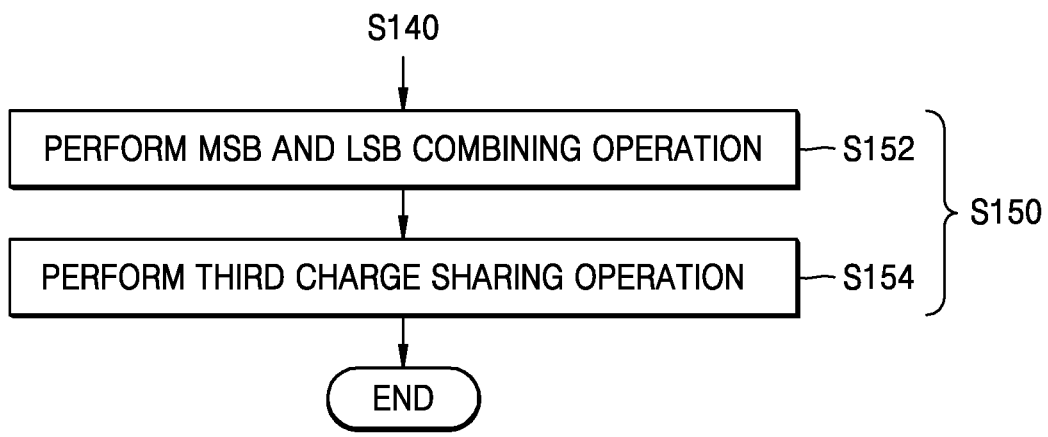

Referring to FIG. 5D and a time point T9 in FIG. 6, in operation 152, the sense amplifier 200 may combine the sensed MSB data of the memory cell MC with the sensed LSB data of the memory cell MC. The sense amplifier 200 may turn off the first latch 210, the power switch SW10, and the third switch SW3, and turn on the second and sixth switches SW2 and SW6 to combine the sensed MSB data with the sensed LSB data.

The second complementary sensing bit line SBLB2 of the second latch 220 latches the MSB data at the logic "0" level, and the first complementary sensing bit line SBLB1 of the first latch 210 latches the LSB data at the logic "0" level.

The second complementary sensing bit line SBLB2, the first sensing bit line pair, i.e., SBL1 and SBLB1, the complementary holding bit line HBLB, and the complementary bit line BLB may be connected to one another by the complementary bit line switch SWb and the second, fourth, and sixth switches SW2, SW4, and SW6. The voltage of the first sensing bit line pair, i.e., SBL1 and SBLB1, the complementary holding bit line HBLB, and the complementary bit line BLB, which are connected to the second complementary sensing bit line SBLB2, may drop to the logic "0" level. At this time, the voltage of the bit line BL and the holding bit line HBL may remain at the logic "0" level.

11. Third Charge Sharing Operation

Referring to FIG. 5D and a time point T10 in FIG. 6, in operation 154, the sense amplifier 200 performs the third charge sharing operation among the first sensing bit line pair, i.e., SBL1 and SBLB1, the holding bit line pair, i.e., HBL and HBLB, and the bit line pair, i.e., BL and BLB. The sense amplifier 200 may turn off the first latch 210 and the sixth switch SW6, and turn on the first and third switches SW1 and SW3 to perform the third charge sharing operation.

The bit line pair, i.e., BL and BLB, the holding bit line pair, i.e., HBL and HBLB, and the first sensing bit line pair, i.e., SBL1 and SBLB1, may be connected to one another by the bit line switch SWa, the complementary bit line switch SWb, and the first through fourth switches SW1 through SW4.

The sense amplifier 200 may perform the third charge sharing operation using the cell capacitance of the memory cell MC, the bit line capacitance of the bit line pair, i.e., BL and BLB, the bit line capacitance of the holding bit line pair, i.e., HBL and HBLB, the bit line capacitance of the first sensing bit line pair, i.e., SBL1 and SBLB1, and variations in the capacitances. As a result of the third charge sharing operation, the voltage of the bit line pair, i.e., BL and BLB, the holding bit line pair, i.e., HBL and HBLB, and the first sensing bit line pair, i.e., SBL1 and SBLB1, becomes the level of the ground voltage VSS. The voltage of the bit line BL having the level of the ground voltage VSS is restored in the memory cell MC as the cell voltage Vcell.

As described above, the sense amplifier 200 senses the cell voltage Vcell of 0 V stored in the memory cell MC as MSB and LSB bits "00" and restores 0 V of the bit line BL, which corresponds to the sensed MSB and LSB bits "00", in the memory cell MC as the cell voltage Vcell.

Figure 7:
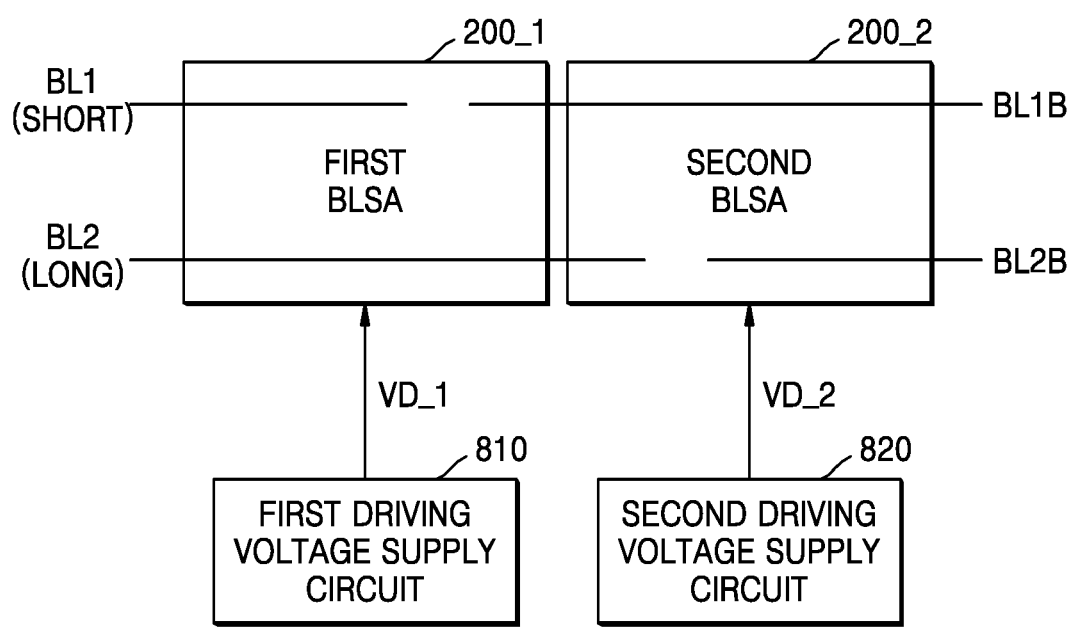
FIG. 7 illustrates a memory device according to an embodiment.

FIG. 7 illustrates the memory device 10 according to an embodiment. The memory device 10 may include the first sense amplifier 200_1, the second sense amplifier 200_2, a first driving voltage supply circuit 810, and a second driving voltage supply circuit 820.

The first sense amplifier 200_1 may be connected to the first bit line BL1 and a first complementary bit line BL1B, and the second sense amplifier 200_2 may be connected to the second bit line BL2 and the second complementary bit line BL2B.

The length of the first bit line BL1, which corresponds to a length from a memory cell to the first sense amplifier 200_1, may be shorter than the length of the second bit line BL2, which corresponds to a length from the memory cell to the second sense amplifier 200_2. Such a length difference between bit lines causes a capacitance difference between the bit lines, and the capacitance difference between the bit lines causes a sensing characteristic difference between sense amplifiers. To compensate for a sensing characteristic difference caused by a length difference between bit lines, the first sense amplifier 200_1 and the second sense amplifier 200_2 may be driven by different driving voltages, respectively.

For this operation, the first driving voltage supply circuit 810 may generate and provide the first driving voltage VD_1 to the first sense amplifier 200_1. As described below with reference to FIG. 9, the first driving voltage VD_1 may include at least one of a first precharge voltage VPRE_1, a first-level first power supply voltage VINTA1_1, and a third-level second power supply voltage VINTA2_1. In an embodiment, the first driving voltage supply circuit 810 may provide the first driving voltage VD_1 to the first sense amplifier 200_1 under the control of the control circuitry 600 in FIG. 1.

Similarly, the second driving voltage supply circuit 820 may generate and provide the second driving voltage VD_2 to the second sense amplifier 200_2. As described below with reference to FIG. 9, the second driving voltage VD_2 may include at least one of a second precharge voltage VPRE_2, a second-level first power supply voltage VINTA1_2, and a fourth-level second power supply voltage VINTA2_2. In an embodiment, the second driving voltage supply circuit 820 may provide the second driving voltage VD_2 to the second sense amplifier 200_2 under the control of the control circuitry 600 in FIG. 1.

The second driving voltage VD_2 may have a different value or different values than the first driving voltage VD_1. The difference between the first driving voltage VD_1 and the second driving voltage VD_2 may correspond to a level for compensating for a length difference between the first bit line BL1 and the second bit line BL2. Therefore, a designer of the memory device 10 may test distribution of fail cells in each bit line with respect to a cell voltage, and set the difference between the first driving voltage VD_1 and the second driving voltage VD_2 based on the distribution of fail cells. This will be described in detail with reference to FIGS. 8 and 13 below.

Although the first driving voltage supply circuit 810 and the second driving voltage supply circuit 820 are illustrated as separate blocks in FIG. 7, embodiments are not limited thereto. According to an embodiment, the first driving voltage supply circuit 810 and the second driving voltage supply circuit 820 may be integrated as a single driving voltage supply circuit generating and providing the first driving voltage VD_1 and the second driving voltage VD2.

According to the present embodiment, the memory device 10 uses voltages having different levels to respectively drive sense amplifiers respectively connected to bit lines having different lengths from each other, thereby compensating for a sensing characteristic difference caused by a length difference between the bit lines.

Figure 8:
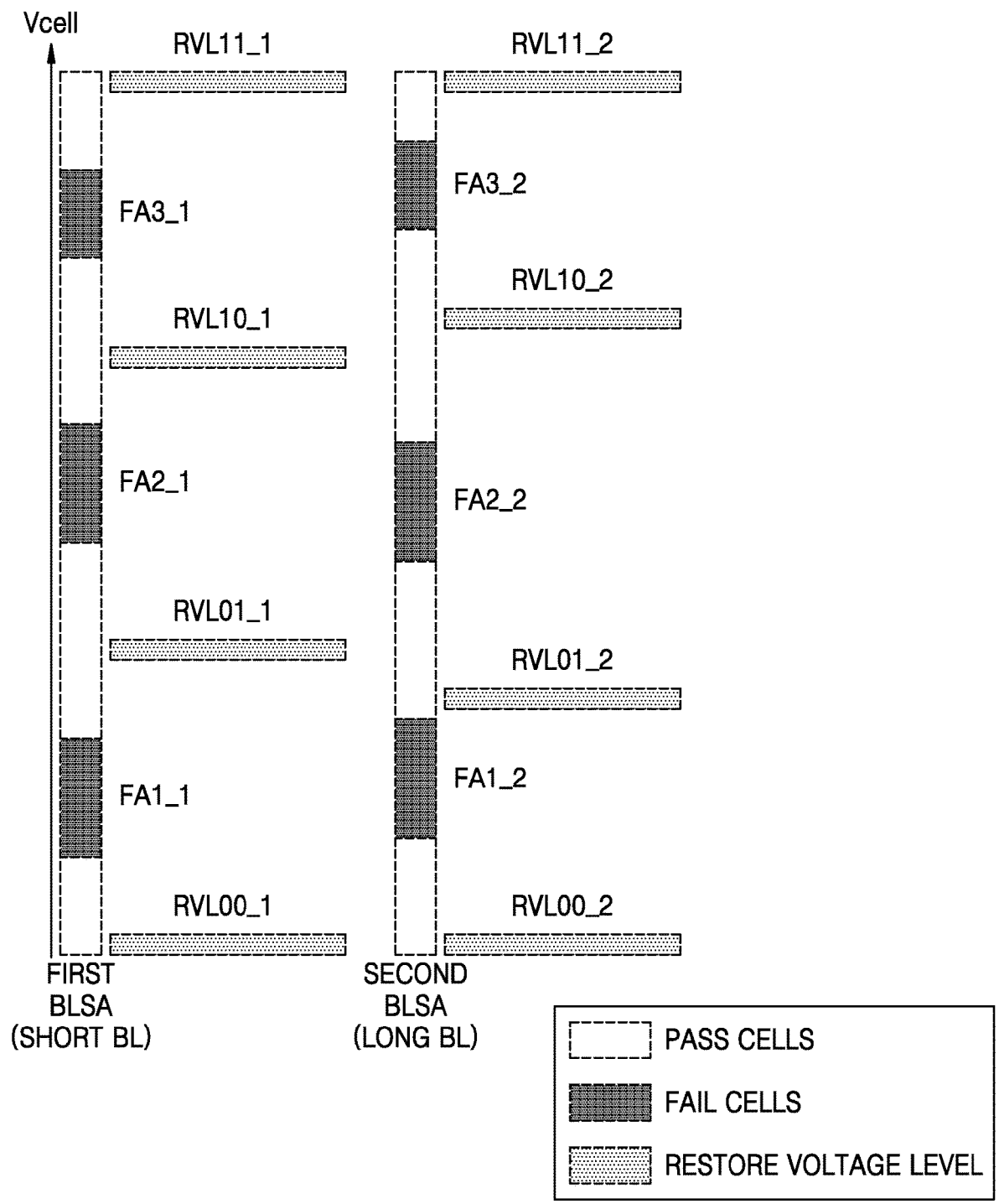
FIG. 8 is a diagram for describing pass cells and fail cells in sense amplifiers, according to an embodiment.

FIG. 8 is a diagram for describing pass cells and fail cells in sense amplifiers, according to an embodiment. FIG. 8 illustrates restore voltage levels RVL00_1, RVL01_1, RVL10_1, RVL11_1, RVL00_2, RVL01_2, RVL10_2, and RVL11_2 for four states "00", "01", "10", and "11" in sense amplifiers, and first through third fail regions FA1_1, FA1_2, FA21, FA2_2, FA3_1, and FA3_2, in which fail occurs in an intermediate area, in a memory device sensing multi-bit data. FIG. 8 will be described with reference to FIG. 7 together. The distribution of pass cells and fail cells in each state illustrated in FIG. 8 is just an example and does not represent a general trend.

As shown in FIG. 8, a sensing characteristic may be different between the first sense amplifier 200_1 and the second sense amplifier 200_2. A sensing characteristic difference between the first sense amplifier 200_1 and the second sense amplifier 200_2 may be caused by a length difference between bit lines respectively connected to the first sense amplifier 200_1 and the second sense amplifier 200_2.

For example, the first fail region FA1_1 with respect to the first sense amplifier 200_1 may be different from the first fail region FA1_2 with respect to the second sense amplifier 200_2, wherein the first fail regions FA1_1 and FA1_2 are between "00" data and "01" data. The second fail region FA2_1 with respect to the first sense amplifier 200_1 may be different from the second fail region FA2_2 with respect to the second sense amplifier 200_2, wherein the second fail regions FA2_1 and FA2_2 are between "01" data and "10" data. The third fail region FA3_1 with respect to the first sense amplifier 200_1 may be different from the third fail region FA3_2 with respect to the second sense amplifier 200_2, wherein the third fail regions FA3_1 and FA3_2 are between "10" data and "11" data.

Here, that the first, second or third fail region FA1_1, FA2_1 or FA3_1 with respect to the first sense amplifier 200_1 is different from the first, second or third fail region FA1_2, FA2_2 or FA3_2 with respect to the second sense amplifier 200_2, respectively, may represent that, in the memory cell array 100, fail memory cell distribution with respect to the first sense amplifier 200_1 is different from fail memory cell distribution with respect to the second sense amplifier 200_2. For example, at least one of a location (with respect to the first sense amplifier 200_1) and a size of the first, second or third fail region FA1_1, FA2_1 or FA3_1 may be different from at least one of a location (with respect to the second sense amplifier 200_2) and a size of the first, second or third fail region FA1_2, FA2_2 or FA3_2, respectively.

In addition, with respect to the first sense amplifier 200_1 and the second sense amplifier 200_2, respectively, the restore voltage levels RVL00_1 and RVL00_2 for "00" data may be different from each other, the restore voltage levels RVL01_1 and RVL01_2 for "01" data may be different from each other, the restore voltage levels RVL10_1 and RVL10_2 for "10" data may be different from each other, and the restore voltage levels RVL11_1 and RVL11_2 for "11" data may be different from each other.

To compensate for the foregoing sensing characteristic differences, that is, at least one of the location of a fail region, the size of the fail region, and the restore voltage level for state, the memory device may apply different driving voltages to the first sense amplifier 200_1 and the second sense amplifier 200_2, respectively.

Figure 10:
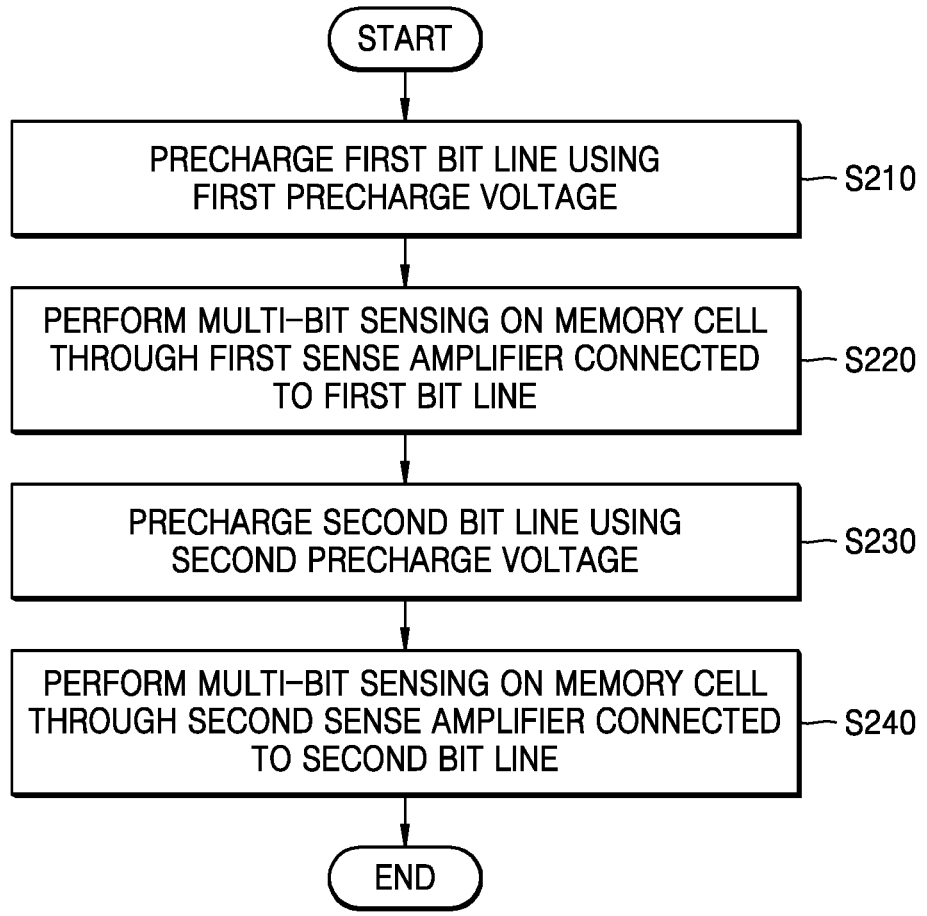
FIG. 10 is a flowchart of a sensing operation of a memory device, according to an embodiment.

For example, referring to FIG. 10, a precharge operation may be performed in the first sense amplifier 200_1 and the second sense amplifier 200_2 using different precharge voltages, respectively. For example, referring to FIG. 11, different driving voltages may be respectively applied to the first sense amplifier 200_1 and the second sense amplifier 200_2 in an MSB sensing operation. For example, referring to FIG. 12, different driving voltages may be respectively applied to the first sense amplifier 200_1 and the second sense amplifier 200_2 in an LSB sensing operation. For example, referring to FIG. 13, different driving voltages may be respectively applied to the first sense amplifier 200_1 and the second sense amplifier 200_2 in a restore operation. Embodiments of the above examples will be described in detail with reference to the drawings below.

A designer of a memory device may test the sensing characteristics of sense amplifiers, as shown in FIG. 8, in a design phase. For example, based on the fail memory cell distribution determined as shown in FIG. 8 according to the test, the designer may determine at least one of the level of the first driving voltage VD_1 to be applied to the first sense amplifier 200_1 and the level of the second driving voltage VD_2 to be applied to the second sense amplifier 200_2. As described above, when voltages respectively driving sense amplifiers are differently set based on a sensing characteristic determined with respect to each sense amplifier, a sensing characteristic difference caused by a length difference between bit lines may be compensated for.

Figure 9:
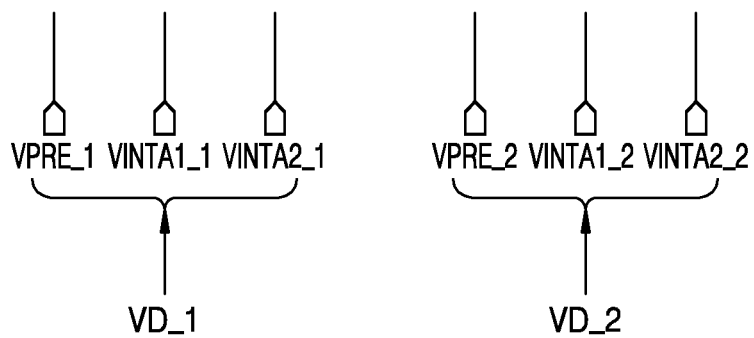
FIG. 9 is a diagram for describing kinds of driving voltages according to an embodiment.

FIG. 9 is a diagram for describing kinds of driving voltages, e.g., the first and second driving voltages VD_1 and VD_2, according to an embodiment. FIG. 9 will be described with reference to FIG. 7 together.

The first driving voltage VD_1 applied to the first sense amplifier 200_1 may include at least one of the first precharge voltage VPRE_1, the first-level first power supply voltage VINTA1_1, and the third-level second power supply voltage VINTA2_1. The second driving voltage VD_2 applied to the second sense amplifier 200_2 may include at least one of the second precharge voltage VPRE_2, the second-level first power supply voltage VINTA1_2, and the fourth-level second power supply voltage VINTA2_2.

At this time, the first precharge voltage VPRE_1 and the second precharge voltage VPRE_2 may correspond to the precharge voltage VPRE. The first-level first power supply voltage VINTA1_1 and the second-level first power supply voltage VINTA1_2 may correspond to the first power supply voltage VINTA1 in FIG. 6. The third-level second power supply voltage VINTA2_1 and the fourth-level second power supply voltage VINTA2_2 may correspond to the second power supply voltage VINTA2 in FIG. 6.

Embodiments for driving sense amplifiers using driving voltages having different voltage levels will be described in detail with reference to the drawings below.

FIG. 10 is a flowchart of a sensing operation of a memory device, according to an embodiment. FIG. 10 will be described with reference to FIGS. 7 and 9 together.

In a precharge operation period of a sensing operation performed on a memory cell connected to the first bit line BL1, the memory device 10 may precharge the first bit line BL1 using the first precharge voltage VPRE_1 in operation S210. For this operation, the first driving voltage supply circuit 810 may supply the first precharge voltage VPRE_1 to the first sense amplifier 200_1.

The memory device 10 may perform multi-bit sensing on the memory cell, which is connected to the first bit line BL1, through the first sense amplifier 200_1 connected to the first bit line BL1 in operation S220. Operation S220 may include a series of processes corresponding to operations S120 through S150 in FIG. 5A.

In a precharge operation period of a sensing operation performed on a memory cell connected to the second bit line BL2, the memory device 10 may precharge the second bit line BL2 using the second precharge voltage VPRE_2 in operation S230. For this operation, the second driving voltage supply circuit 820 may supply the second precharge voltage VPRE_2 to the second sense amplifier 200_2.

In an embodiment, the second precharge voltage VPRE_2 may have a different voltage level than the first precharge voltage VPRE_1, and the difference between the first precharge voltage VPRE_1 and the second precharge voltage VPRE_2 may correspond to a level for compensating for a sensing characteristic difference caused by the difference between the length of the first bit line BL1 and the length of the second bit line BL2.

The memory device 10 may perform multi-bit sensing on the memory cell, which is connected to the second bit line BL2, through the second sense amplifier 200_2 connected to the second bit line BL2 in operation S240. Operation S240 may include a series of processes corresponding to operations S120 through S150 in FIG. 5A.

Although operations S230 and S240 are sequentially performed after operations S210 and S220 in FIG. 10, embodiments are not limited thereto. For example, operations S230 and S240 may be simultaneously performed with operations S210 and S220. In other words, operations S230 and S240 may be performed in parallel with operations S210 and S220.

Figure 11:
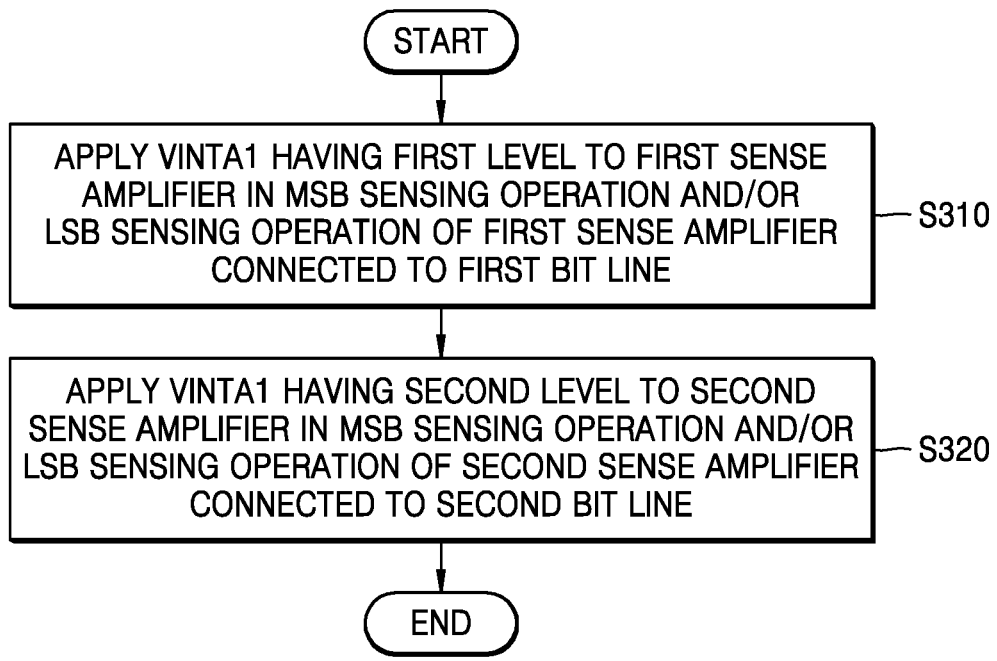
FIG. 11 is a flowchart of a sensing operation of a memory device, according to an embodiment.

FIG. 11 is a flowchart of a sensing operation of a memory device, according to an embodiment. FIG. 11 will be described with reference to FIGS. 7 and 9 together.

In an MSB sensing operation and/or an LSB sensing operation of the first sense amplifier 200_1 connected to the first bit line BL1, the memory device 10 may apply the first-level first power supply voltage VINTA1_1 to the first sense amplifier 200_1 in operation S310. In an embodiment, in the MSB sensing operation and/or the LSB sensing operation of the first sense amplifier 200_1, the first-level first power supply voltage VINTA1_1 may be applied to a first latch pull-up driving signal in a first latch of the first sense amplifier 200_1.

In an MSB sensing operation and/or an LSB sensing operation of the second sense amplifier 200_2 connected to the second bit line BL2, the memory device 10 may apply the second-level first power supply voltage VINTA1_2 to the second sense amplifier 200_2 in operation S320. In an embodiment, in the MSB sensing operation and/or the LSB sensing operation of the second sense amplifier 200_2, the second-level first power supply voltage VINTA1_2 may be applied to a first latch pull-up driving signal in a first latch of the second sense amplifier 200_2.

In an embodiment, the second-level first power supply voltage VINTA1_2 may have a different voltage level than the first-level first power supply voltage VINTA1_1, and the difference between first-level first power supply voltage VINTA1_1 and the second-level first power supply voltage VINTA1_2 may correspond to a level for compensating for a sensing characteristic difference caused by the difference between the length of the first bit line BL1 and the length of the second bit line BL2.

Although operation S320 is sequentially performed after operation S310 in FIG. 11, embodiments are not limited thereto. For example, operation S310 may be simultaneously performed with operation S320. In other words, operation S310 may be performed in parallel with operation S320.

Figure 12:
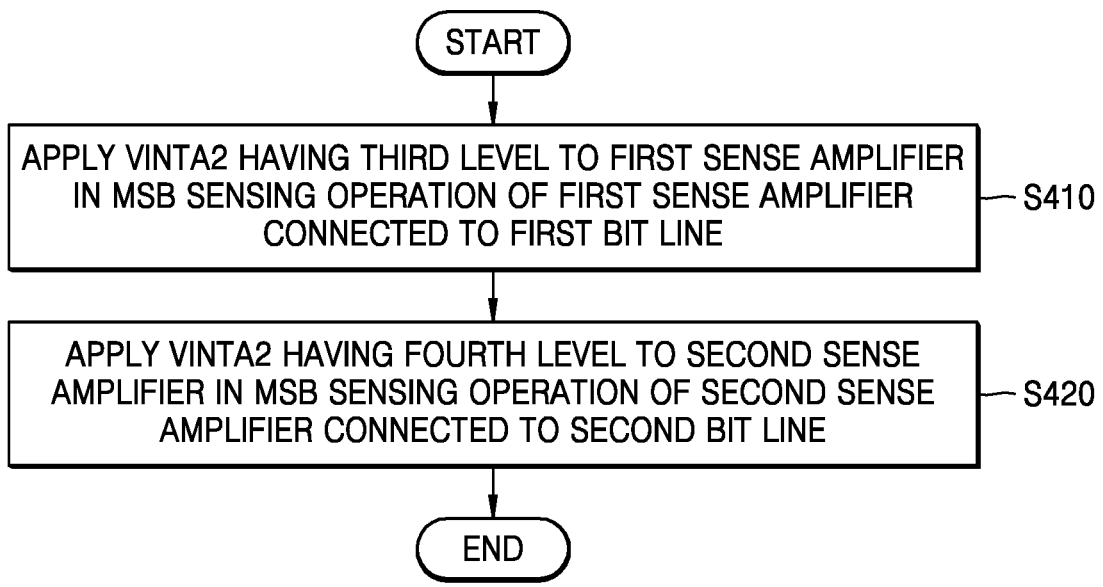
FIG. 12 is a flowchart of a sensing operation of a memory device, according to an embodiment.

FIG. 12 is a flowchart of a sensing operation of a memory device, according to an embodiment. FIG. 12 will be described with reference to FIGS. 7 and 9 together.

In an MSB sensing operation of the first sense amplifier 200_1 connected to the first bit line BL1, the memory device 10 may apply the third-level second power supply voltage VINTA2_1 to the first sense amplifier 200_1 in operation S410. In an embodiment, in the MSB sensing operation of the first sense amplifier 200_1, the third-level second power supply voltage VINTA2_1 may be applied to a second latch pull-up driving signal in a second latch of the first sense amplifier 200_1.

In an MSB sensing operation of the second sense amplifier 200_2 connected to the second bit line BL2, the memory device 10 may apply the fourth-level second power supply voltage VINTA2_2 to the second sense amplifier 200_2 in operation S420. In an embodiment, in the MSB sensing operation of the second sense amplifier 200_2, the fourth-level second power supply voltage VINTA2_2 may be applied to a second latch pull-up driving signal in a second latch of the second sense amplifier 200_2.

In an embodiment, the fourth-level second power supply voltage VINTA2_2 may have a different voltage level than the third-level second power supply voltage VINTA2_1, and the difference between the third-level second power supply voltage VINTA2_1 and the fourth-level second power supply voltage VINTA2_2 may correspond to a level for compensating for a sensing characteristic difference caused by the difference between the length of the first bit line BL1 and the length of the second bit line BL2.

Figure 13:
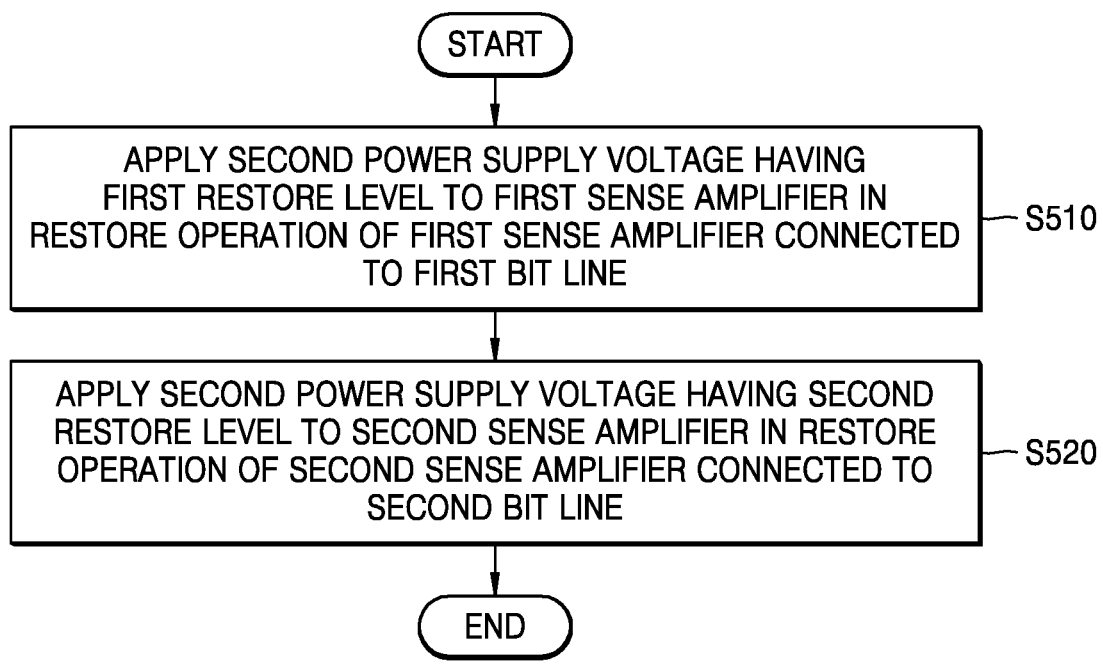
FIG. 13 is a flowchart of a sensing operation of a memory device, according to an embodiment.

FIG. 13 is a flowchart of a sensing operation of a memory device, according to an embodiment. FIG. 13 will be described with reference to FIGS. 7 and 9 together.

In a restore operation of the first sense amplifier 200_1 connected to the first bit line BL1, the memory device 10 may apply a second power supply voltage having a first restore level to the first sense amplifier 200_1 in operation S510. In an embodiment, in the restore operation of the first sense amplifier 200_1, the second power supply voltage having the first restore level may be applied to a second latch pull-up driving signal in a second latch of the first sense amplifier 200_1.

In a restore operation of the second sense amplifier 200_2 connected to the second bit line BL2, the memory device 10 may apply the second power supply voltage having a second restore level to the second sense amplifier 200_2 in operation S520. In an embodiment, in the restore operation of the second sense amplifier 200_2, the second power supply voltage having the second restore level may be applied to a second latch pull-up driving signal in a second latch of the second sense amplifier 200_2.

In an embodiment, the second power supply voltage having the second restore level may have a different voltage level than the second power supply voltage having the first restore level, and the difference between the first restore level and the second restore level may correspond to a level for compensating for a sensing characteristic difference caused by the difference between the length of the first bit line BL1 and the length of the second bit line BL2.

Figure 14:
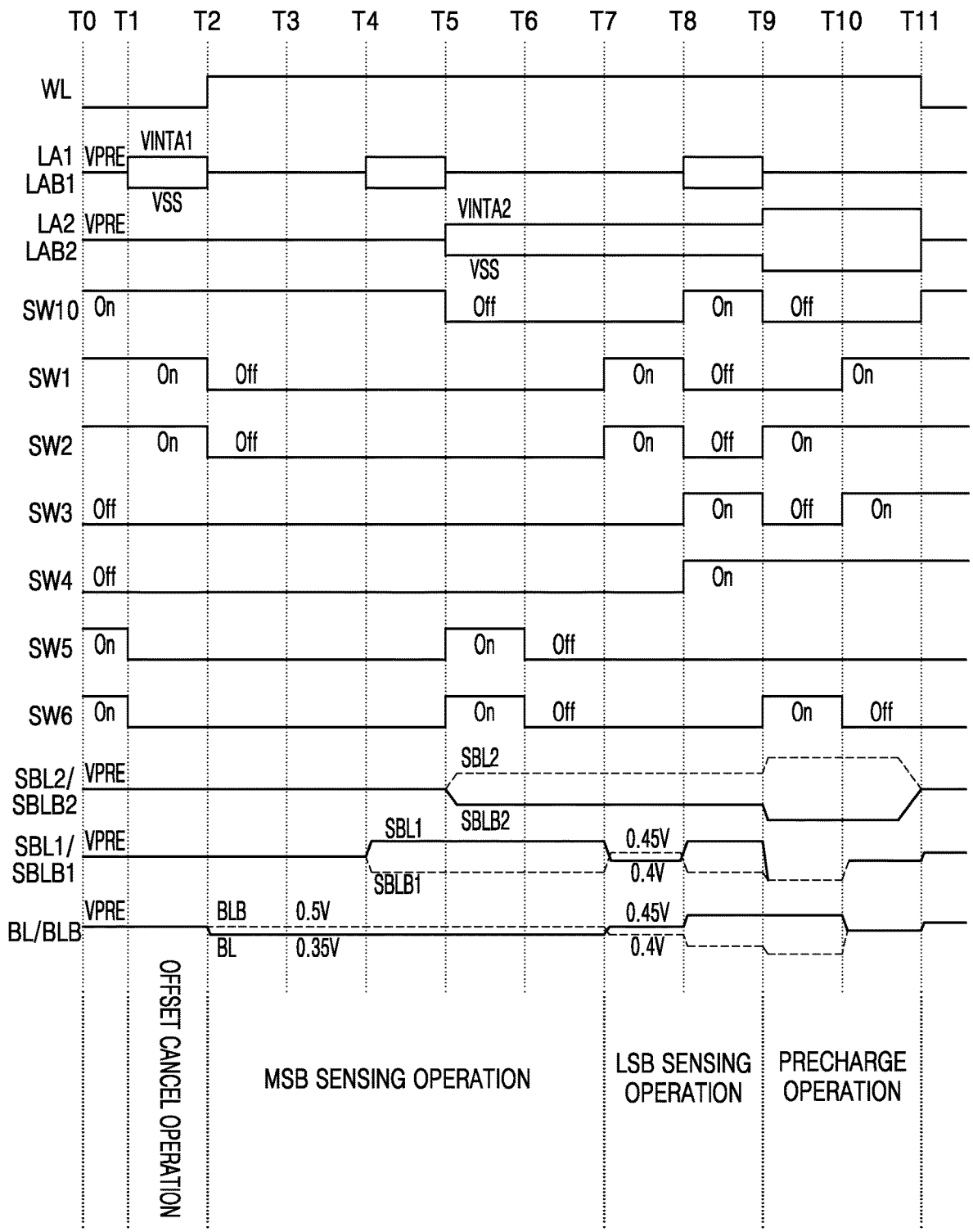
FIG. 14 is a timing diagram of signals of a memory device, according to an embodiment.

FIG. 14 is a timing diagram of signals of a memory device, according to an embodiment. As described above, FIG. 14 shows variations of embodiments using different driving voltages for the first sense amplifier 200_1 and the second sense amplifier 200_2, respectively. FIG. 14 will be described with reference to FIG. 7 and FIGS. 10 through 13 together.

Referring to FIGS. 10 and 14, in the precharge operation period, the precharge voltage VPRE for precharging bit lines may be different between the first sense amplifier 200_1 and the second sense amplifier 200_2.

Referring to FIGS. 11 and 14, in the MSB sensing operation period and/or the LSB sensing operation period, the first power supply voltage VINTA1 applied to the first latch pull-up driving signal LA1 in a first latch may be different between the first sense amplifier 200_1 and the second sense amplifier 200_2.

Referring to FIGS. 12 and 14, in the MSB sensing operation period, the second power supply voltage VINTA2 applied to the second latch pull-up driving signal LA2 in a second latch may be different between the first sense amplifier 200_1 and the second sense amplifier 200_2.

Referring to FIGS. 13 and 14, in the restore operation period, a second power supply voltage and a second pull-down voltage respectively applied to the second latch pull-up driving signal LA2 and the second latch pull-down driving signal LAB2 in a second latch may be different between the first sense amplifier 200_1 and the second sense amplifier 200_2.

A method of compensating for a sensing characteristic difference caused by a length difference between bit lines may vary as described above with reference to FIGS. 10 through 13, and at least two of the methods of FIGS. 10 through 13 may be simultaneously used in an embodiment. In other words, both the level of a precharge voltage and the level of a first power supply voltage may be different between the first sense amplifier 200_1 and the second sense amplifier 200_2, according to an embodiment.

Figure 15:
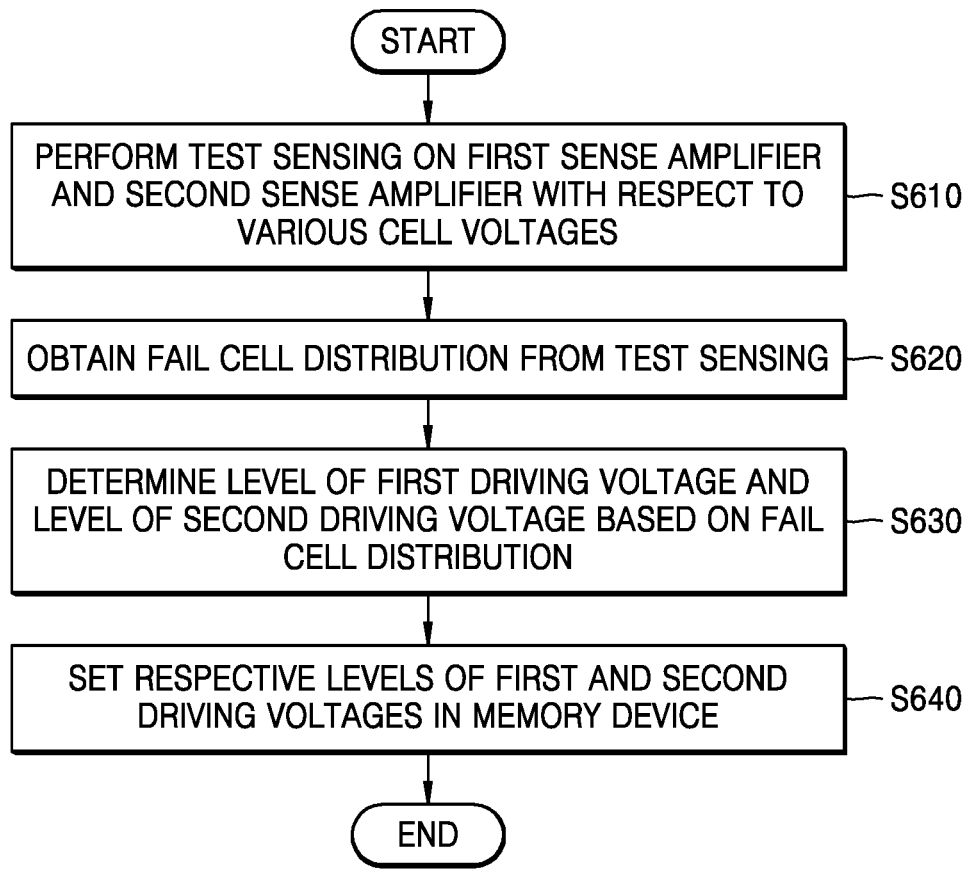
FIG. 15 is a flowchart of a method of setting a driving voltage in a memory device, according to an embodiment.

FIG. 15 is a flowchart of a method of setting a driving voltage in a memory device, according to an embodiment. FIG. 15 will be described with reference to FIG. 7 together.

In operation S610, a designer of a memory device may perform test sensing on a plurality of sense amplifiers including the first sense amplifier 200_1 and the second sense amplifier 200_2 with respect to various cell voltages Vcell.

In operation S620, the designer may obtain fail cell distribution from the test sensing performed in operation S610. The designer may obtain fail cell distribution with respect to the first sense amplifier 200_1 and fail cell distribution with respect to the second sense amplifier 200_2. In an embodiment, the obtained fail cell distribution may appear as shown in FIG. 8.

In operation S630, the designer may determine a level of the first driving voltage VD_1 and a level of the second driving voltage VD_2 based on the obtained fail cell distribution in operation S630.

In operation S640, the designer may set the determined levels of the first and second driving voltages VD_1 and VD_2 in the memory device 10. The memory device 10 may drive the first sense amplifier 200_1 based on the set level of the first driving voltage VD_1 and the second sense amplifier 200_2 based on the set level of the second driving voltage VD_2.

When the driving voltage setting method according to the present embodiment is used, a sensing characteristic difference caused by the difference between the length of a first bit line and a length of a second bit line may be effectively compensated for.

Figure 16:
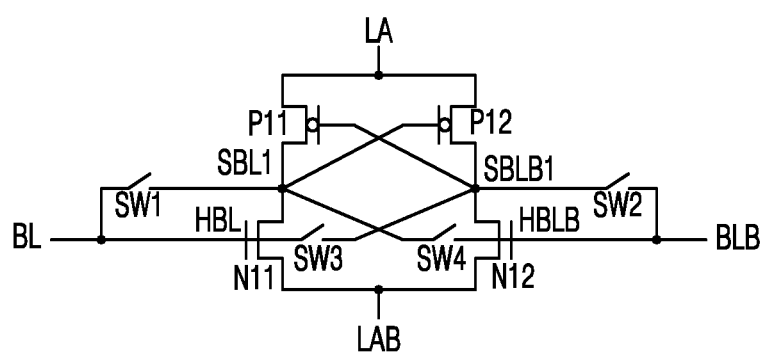
FIG. 16 illustrates a sense amplifier according to an embodiment.

FIG. 16 illustrates the sense amplifier 200 according to an embodiment. FIG. 16 illustrates the sense amplifier 200 which may perform a sensing operation on single-bit data. FIG. 16 will be described with reference to FIG. 7 together.

Compared to the sense amplifier 200 of FIG. 4, the sense amplifier 200 of FIG. 16 may include only one latch because the sense amplifier 200 needs to sense a single bit. The operation of the latch is similar to that of the first latch in FIG. 4, and thus detailed descriptions thereof will be omitted.

Each of the first sense amplifier 200_1 and the second sense amplifier 200_2 may correspond to the sense amplifier 200 of FIG. 16. At this time, there still occurs a sensing characteristic difference caused by the difference between the length of the first bit line BL1 and the length of the second bit line BL2.

To compensate such sensing characteristic difference caused by a length difference between bit lines, similarly to the descriptions give above with reference to the drawing, different precharge voltages may be respectively used for sense amplifiers 200 that perform a sensing operation on single-bit data. Representative embodiments will be described with reference to the drawings below.

Figure 17:
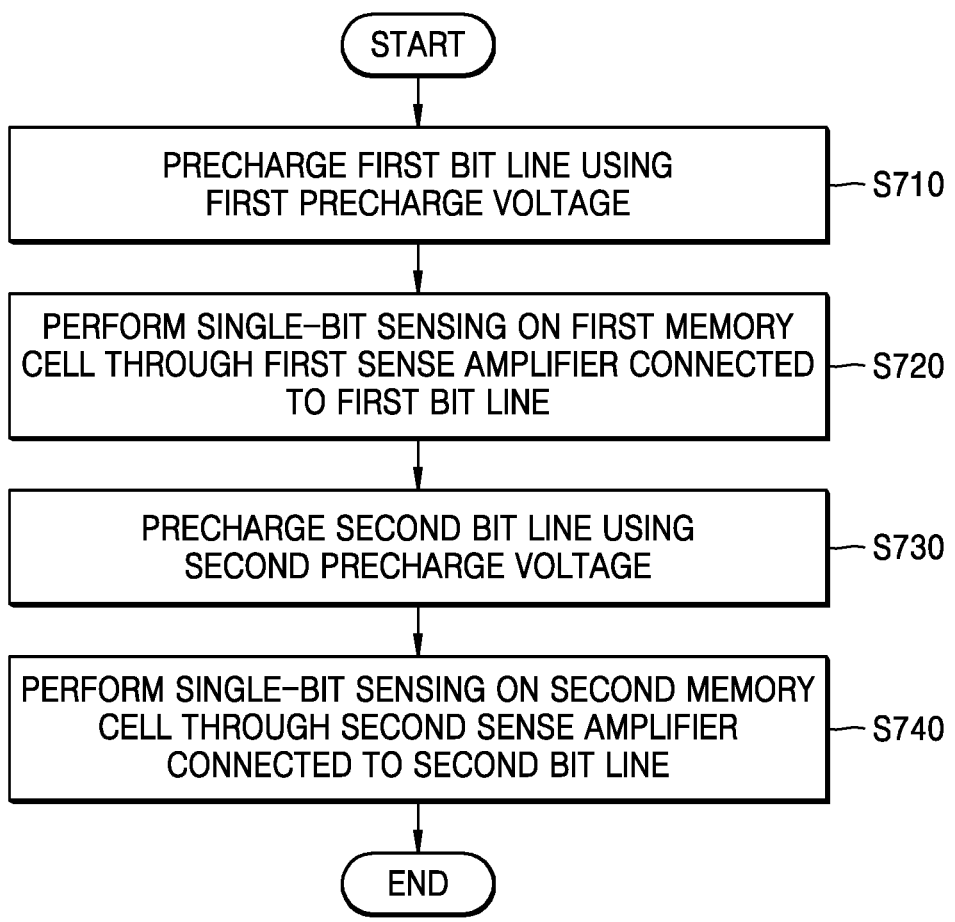
FIG. 17 is a flowchart of a sequential operating method of a sense amplifier, according to an embodiment.

FIG. 17 is a flowchart of a sequential operating method of a sense amplifier, according to an embodiment. FIG. 17 will be described with reference to FIGS. 7 and 16 together.

In a precharge operation period of a sensing operation on a memory cell connected to the first bit line BL1, the memory device 10 may precharge the first bit line BL1 using the first precharge voltage VPRE_1 in operation S710. For this operation, the first driving voltage supply circuit 810 may supply the first precharge voltage VPRE_1 to the first sense amplifier 200_1.

The memory device 10 may perform single-bit sensing on the memory cell, which is connected to the first bit line BL1, through the first sense amplifier 200_1 connected to the first bit line BL1 in operation S720. Operation S720 may include a series of processes of sensing single-bit data from the memory cell.

In a precharge operation period of a sensing operation performed on a memory cell connected to the second bit line BL2, the memory device 10 may precharge the second bit line BL2 using the second precharge voltage VPRE_2 in operation S730. For this operation, the second driving voltage supply circuit 820 may supply the second precharge voltage VPRE_2 to the second sense amplifier 200_2.

In an embodiment, the second precharge voltage VPRE_2 may have a different voltage level than the first precharge voltage VPRE_1, and the difference between the first precharge voltage VPRE_1 and the second precharge voltage VPRE_2 may correspond to a level for compensating for a sensing characteristic difference caused by the difference between the length of the first bit line BL1 and the length of the second bit line BL2.

The memory device 10 may perform single-bit sensing on the memory cell, which is connected to the second bit line BL2, through the second sense amplifier 200_2 connected to the second bit line BL2 in operation S740. Operation S740 may include a series of processes of sensing single-bit data from the memory cell.

Figure 18:
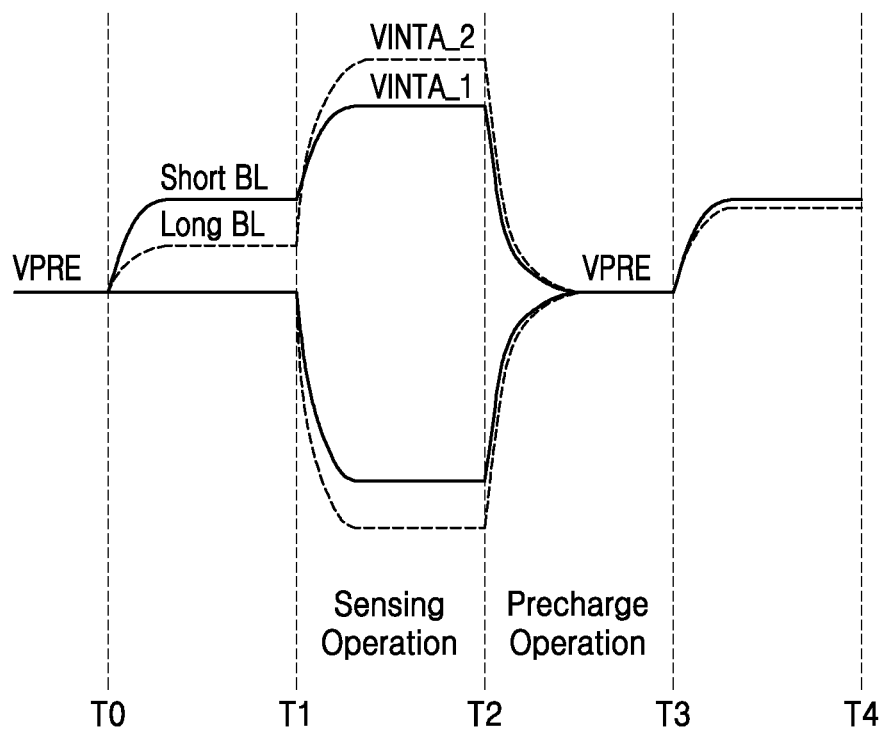
FIG. 18 is a timing diagram of signals in sensing and precharge operations of bit lines, according to an embodiment.

In an embodiment, a long bit line Long BL in FIG. 18 may correspond to a sense amplifier located at an edge of the memory device 10.

FIG. 18 is a timing diagram of signals in sensing and precharge operations of bit lines, e.g., a short bit line Short BL and a long bit line Long BL, according to an embodiment. FIG. 18 will be described with reference to FIG. 7 together.

In a sensing operation period between the time points T1 and T2, the long bit line Long BL may be driven using a second driving voltage VINTA_2, which is higher than a first driving voltage VINTA_1 corresponding to the short bit line Short BL. Accordingly, in an operation period between the time points T3 and T4, the voltage level of the long bit line Long BL is substantially the same as the voltage level of the short bit line Short BL.

According to an embodiment, the precharge voltage VPRE may be different between the long bit line Long BL and the short bit line Short BL in a period between the time points T2 and T3. However, embodiments are not limited thereto, and the precharge voltage VPRE may be the same between the long bit line Long BL and the short bit line Short BL.

Figure 19:
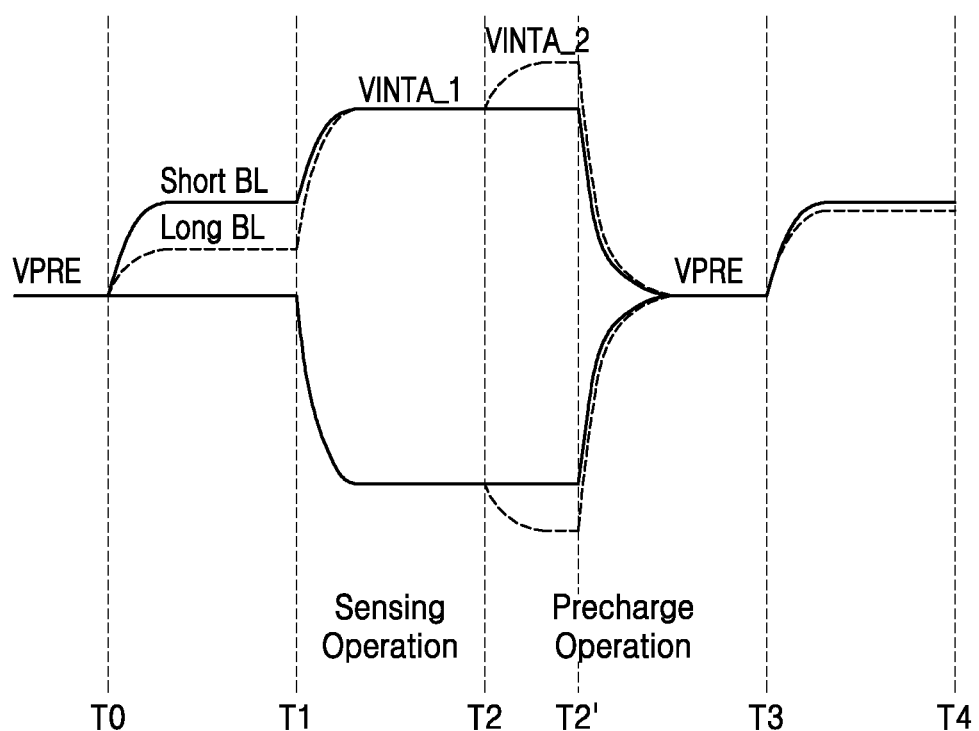
FIG. 19 is a timing diagram of signals sensing and precharge operations of bit lines, according to an embodiment.

FIG. 19 is a timing diagram of signals in sensing and precharge operations of bit lines, e.g., a short bit line Short BL and a long bit line Long BL, according to an embodiment. FIG. 19 shows an embodiment which is similar to but is different from the embodiment of FIG. 18.

Referring to FIG. 19, both the long bit line Long BL and the short bit line Short BL may be precharged using the first driving voltage VINTA_1 in the sensing operation period between the time points T1 and T2.

However, in a period between the time point T2 and a time point T2', voltage boosting may be performed on only the long bit line Long BL. At this time, the voltage level of the long bit line Long BL may rise up to the voltage level of the second driving voltage VINTA_2. Accordingly, substantially the same effect as that in the embodiment using different driving voltages in FIG. 18 may occur. Therefore, the voltage level of the long bit line Long BL is substantially the same as the voltage level of the short bit line Short BL in the operation period between the time points T3 and T4.

While the inventive concept has been particularly shown and described with reference to embodiments thereof, it will be understood that various changes in form and details may be made therein without departing from the spirit and scope of the following claims.

What is claimed is:

1. A volatile memory device comprising:
a first sense amplifier connected to a first memory cell through a first bit line, and configured to sense 2-bit data stored in the first memory cell;
a second sense amplifier connected to a second memory cell through a second bit line, and configured to sense 2-bit data stored in the second memory cell, the second bit line having a length greater than a length of the first bit line; and
a driving voltage supply circuit configured to supply a first driving voltage to the first sense amplifier, and supply a second driving voltage to the second sense amplifier, the second driving voltage having a voltage level different from a voltage level of the first driving voltage,
wherein the first sense amplifier is not connected to the second bit line, and the second sense amplifier is not connected to the first bit line.

2. The volatile memory device of claim 1, wherein the driving voltage supply circuit is further configured to:
precharge the first bit line using a first precharge voltage by supplying the first precharge voltage in a precharge period of a sensing operation on the first memory cell; and
precharge the second bit line using a second precharge voltage by supplying the second precharge voltage in a precharge period of a sensing operation on the second memory cell,
wherein the second precharge voltage is different from the first precharge voltage.

3. The volatile memory device of claim 2, wherein a difference between the first precharge voltage and the second precharge voltage corresponds to a difference between a capacitance of the first bit line and a capacitance of the second bit line.

4. The volatile memory device of claim 1, wherein the first sense amplifier comprises:

a first latch configured to sense a least significant bit (LSB) of the 2-bit data stored in the first memory cell, and latch the LSB to a first sensing bit line pair; and
a second latch configured to sense a most significant bit (MSB) of the 2-bit data stored in the first memory cell, and latch the MSB to a second sensing bit line pair, and
wherein the second sense amplifier comprises:
a third latch configured to sense an LSB of the 2-bit data stored in the second memory cell, and latch the LSB to a third sensing bit line pair; and
a fourth latch configured to sense an MSB of the 2-bit data stored in the second memory cell, and latch the MSB to a fourth sensing bit line pair.

5. The volatile memory device of claim 4, wherein the driving voltage supply circuit is further configured to:
supply a first power supply voltage having a first voltage level to the first sense amplifier to drive a pull-up terminal of the first latch in at least one of an MSB sensing operation period and an LSB sensing operation period of a sensing operation on the first memory cell; and
supply the first power supply voltage having a second voltage level to the second sense amplifier to drive a pull-up terminal of the third latch in at least one of an MSB sensing operation period and an LSB sensing operation period of a sensing operation on the second memory cell.

6. The volatile memory device of claim 5, wherein a difference between the first voltage level and the second voltage level corresponds to a difference between the length of the first bit line and the length of the second bit line.

7. The volatile memory device of claim 4, wherein the driving voltage supply circuit is further configured to:
supply a first power supply voltage having a first voltage level to the first sense amplifier to drive a pull-up terminal of the second latch in an MSB sensing operation period of a sensing operation on the first memory cell; and
supply the first power supply voltage having a second voltage level to the second sense amplifier to drive a pull-up terminal of the fourth latch in an MSB sensing operation period of a sensing operation on the second memory cell.

8. The volatile memory device of claim 7, wherein a difference between the first voltage level and the second voltage level corresponds to a voltage level for compensating for a difference between a sensing characteristic of the first sense amplifier and a sensing characteristic of the second sense amplifier.

9. The volatile memory device of claim 4, wherein the driving voltage supply circuit is further configured to:
supply a first power supply voltage having a first voltage level to the first sense amplifier to drive a pull-up terminal of the second latch in a restore operation period of a sensing operation on the first memory cell; and
supply the first power supply voltage having a second voltage level to the second sense amplifier to drive a pull-up terminal of the fourth latch in a restore operation period of a sensing operation on the second memory cell.

10. The volatile memory device of claim 9, wherein the driving voltage supply circuit is further configured to:
supply a first pull-down voltage having a third voltage level to the first sense amplifier to drive a pull-down terminal of the second latch in the restore operation period of the sensing operation on the first memory cell; and supply the first pull-down voltage having a fourth voltage level to the second sense amplifier to drive a pull-down terminal of the fourth latch in the restore operation period of the sensing operation on the second memory cell.

11. A data sensing method of a volatile memory device, the data sensing method comprising:

precharging a first bit line using a first precharge voltage;

sensing first 2-bit data through a first sense amplifier connected to the first bit line, the first 2-bit data being stored in a first memory cell connected between the first bit line and a selected word line;

precharging a second bit line using a second precharge voltage different from the first precharge voltage, the second bit line having a length greater than a length of the first bit line; and sensing second 2-bit data through a second sense amplifier connected to the second bit line, the second 2-bit data being stored in a second memory cell connected between the second bit line and the selected word line, wherein the first sense amplifier is not connected to the second bit line, and the second sense amplifier is not connected to the first bit line.

12. The data sensing method of claim 11, wherein a difference between the first precharge voltage and the second precharge voltage corresponds to a level for compensating for a difference between a sensing characteristic of the first sense amplifier and a sensing characteristic of the second sense amplifier.

13. The data sensing method of claim 11, wherein the sensing the first 2-bit data comprises:

sensing a most significant bit (MSB) of the first 2-bit data using a first latch driven based on a first power supply voltage; and latching the MSB of the first 2-bit data in a second latch driven based on a second power supply voltage, and wherein the sensing the second 2-bit data comprises:

sensing an MSB of the second 2-bit data using a third latch driven based on a third power supply voltage; and latching the MSB of the second 2-bit data in a fourth latch driven based on a fourth power supply voltage.

14. The data sensing method of claim 13, wherein a voltage level of the first power supply voltage is different from a voltage level of the third power supply voltage, and wherein a difference between the voltage level of the first power supply voltage and the voltage level of the third power supply voltage corresponds to a difference between a capacitance of the first bit line and a capacitance of the second bit line.

15. The data sensing method of claim 13, wherein a voltage level of the second power supply voltage is different from a voltage level of the fourth power supply voltage, and wherein a difference between the voltage level of the second power supply voltage and the voltage level of the fourth power supply voltage corresponds to a difference between the length of the first bit line and the length of the second bit line.

16. The data sensing method of claim 11, further comprising:

restoring the sensed first 2-bit data in the first memory cell based on a first pull-up driving voltage and a first pull-down driving voltage; and restoring the sensed second 2-bit data in the second memory cell based on a second pull-up driving voltage and a second pull-down driving voltage, wherein the first pull-up driving voltage is different from the second pull-up driving voltage, and the first pull-down driving voltage is different from the second pull-down driving voltage.

17. The data sensing method of claim 11, wherein a difference between the first precharge voltage and the second precharge voltage is determined based on fail cell distribution appearing when a plurality of cell voltages are applied to each of the first sense amplifier and the second sense amplifier.

18. The volatile memory device of claim 1, wherein a highest voltage level of the second driving voltage is different from a highest voltage level of the first driving voltage.

* * * * *